US009933496B2

(12) United States Patent
Holm et al.

(10) Patent No.: US 9,933,496 B2
(45) Date of Patent: Apr. 3, 2018

(54) MAGNETIC FIELD SENSOR WITH MULTIPLE AXIS SENSE CAPABILITY

(71) Applicant: FREESCALE SEMICONDUCTOR, INC., Austin, TX (US)

(72) Inventors: Paige M. Holm, Phoenix, AZ (US); Lianjun Liu, Chandler, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 15/134,573

(22) Filed: Apr. 21, 2016

(65) Prior Publication Data
US 2017/0307697 A1 Oct. 26, 2017

(51) Int. Cl.
*G01R 33/02* (2006.01)
*G01R 33/025* (2006.01)
*G01R 33/09* (2006.01)

(52) U.S. Cl.
CPC ....... *G01R 33/025* (2013.01); *G01R 33/0206* (2013.01); *G01R 33/098* (2013.01)

(58) Field of Classification Search
CPC .................................................. G01R 33/098
USPC .................................................. 324/245, 252
See application file for complete search history.

(56) References Cited

U.S. PATENT DOCUMENTS

| 5,592,082 | A | 1/1997 | Kuriyama |
| 5,737,155 | A | 4/1998 | George et al. |
| 6,501,678 | B1 | 12/2002 | Lenssen et al. |
| 7,589,528 | B2 | 9/2009 | Sato et al. |
| 7,965,077 | B2 | 6/2011 | Engel et al. |
| 8,816,683 | B2 | 8/2014 | Wang et al. |
| 2004/0023064 | A1* | 2/2004 | Ehresmann ............ B82Y 25/00 324/648 |
| 2004/0137275 | A1 | 7/2004 | Jander et al. |

(Continued)

FOREIGN PATENT DOCUMENTS

| EP | 2 860 542 A1 | 4/2015 |
| EP | 2 860 543 A1 | 4/2015 |

(Continued)

OTHER PUBLICATIONS

Restriction/Election; U.S. Appl. No. 15/079,764; 8 pages (Aug. 4, 2017).

(Continued)

*Primary Examiner* — Reena Aurora
(74) *Attorney, Agent, or Firm* — Charlene R. Jacobsen

(57) ABSTRACT

A sensor for sensing an external magnetic field along a sensing direction comprises a sensor bridge. The sensor bridge has a first sensor leg that includes a first magnetoresistive sense element and a second sensor leg that includes a second magnetoresistive sense element. The first and second sense elements have respective first and second pinned layers having the same reference magnetization. The first and second sense elements have respective first and second sense layers, each self-biased to have a first sense magnetization. A permanent magnet layer is proximate the second sense element. In the absence of an external magnetic field, the permanent magnet layer magnetically biases the first sense magnetization of the second sense layer produce a second sense magnetization of the second sense layer that differs from the first sense magnetization, and the first sense layer of the first sense element retains the first sense magnetization.

20 Claims, 10 Drawing Sheets

(56) References Cited

U.S. PATENT DOCUMENTS

| | | |
|---|---|---|
| 2009/0027048 A1 | 1/2009 | Sato et al. |
| 2009/0237074 A1 | 9/2009 | Kou et al. |
| 2010/0118447 A1* | 5/2010 | Hammerschmidt .... H01L 41/47 360/315 |
| 2010/0231214 A1 | 9/2010 | Zhou |
| 2010/0276389 A1 | 11/2010 | Mather et al. |
| 2011/0074406 A1 | 3/2011 | Mather et al. |
| 2011/0134572 A1 | 6/2011 | Qiu et al. |
| 2011/0244599 A1 | 10/2011 | Whig et al. |
| 2012/0212217 A1 | 8/2012 | Engel et al. |
| 2012/0281319 A1 | 11/2012 | Singleton et al. |
| 2013/0277781 A1 | 10/2013 | Deak et al. |
| 2013/0300402 A1 | 11/2013 | Liu et al. |
| 2013/0328556 A1 | 12/2013 | Granig et al. |
| 2014/0021571 A1 | 1/2014 | Lei et al. |
| 2014/0035570 A1 | 2/2014 | Jin et al. |
| 2014/0035573 A1 | 2/2014 | Deak et al. |
| 2014/0225605 A1 | 8/2014 | Lei et al. |
| 2014/0247042 A1 | 9/2014 | Lei et al. |
| 2014/0292318 A1 | 10/2014 | Wang et al. |
| 2014/0327437 A1 | 11/2014 | Han et al. |
| 2015/0091560 A1 | 4/2015 | Deak et al. |
| 2015/0125966 A1 | 5/2015 | Liu et al. |
| 2015/0137292 A1 | 5/2015 | Amiri et al. |
| 2015/0145504 A1 | 5/2015 | Bai et al. |
| 2015/0309125 A1 | 10/2015 | Huang et al. |
| 2015/0346290 A1 | 12/2015 | Holm et al. |
| 2015/0364677 A1 | 12/2015 | Deak et al. |
| 2016/0056371 A1 | 2/2016 | Lei et al. |
| 2017/0123016 A1 | 5/2017 | Deak |
| 2017/0212175 A1 | 7/2017 | Holm et al. |
| 2017/0212176 A1 | 7/2017 | Holm et al. |
| 2017/0212189 A1 | 7/2017 | Holm et al. |
| 2017/0276738 A1 | 9/2017 | Holm et al. |

FOREIGN PATENT DOCUMENTS

| | | |
|---|---|---|
| EP | 3 229 035 A1 | 10/2017 |
| WO | 2008/020817 A1 | 2/2008 |
| WO | 2015/158243 A1 | 10/2015 |

OTHER PUBLICATIONS

Notice of Allowance; U.S. Appl. No. 15/006,746; 16 pages (dated Nov. 16, 2017).

Notice of Allowance; U.S. Appl. No. 15/006,911; 14 pages (dated Oct. 6, 2017).

Notice of Allowance; U.S. Appl. No. 15/006,746; 12 pages (dated Sep. 15, 2017).

Non Final Office Action; U.S. Appl. No. 15/006,746; 25 pages (dated Apr. 4, 2017).

Non Final Office Action; U.S. Appl. No. 15/079,764; 38 pages (dated Oct. 11, 2017).

U.S. Appl. No. 15/093,224; Not Yet Published; filed Apr. 7, 2016.

Notice of Allowance; U.S. Appl. No. 15/006,952; dated May 10, 2017.

Notice of Allowance; U.S. Appl. No. 15/006,911; 13 pages (dated Oct. 30, 2017).

* cited by examiner

MAGNETIC FIELD SENSOR WITH MULTIPLE AXIS SENSE CAPABILITY

TECHNICAL FIELD OF THE INVENTION

The present invention relates generally to magnetoelectronic devices. More specifically, the present invention relates to a magnetic field sensor with multiple axis sensing and permanent magnet biasing.

BACKGROUND OF THE INVENTION

Magnetic field sensors, also known as magnetometers, are widely used in a number of applications including in, for example, compass, security, and military applications, geophysics and space research, biomagnetism and medical applications, and non-destructive testing. Magnetic field sensors are typically based on semiconductor materials (e.g., Hall sensors, magnetoresistors, and so forth) and ferromagnetic materials (e.g., ferromagnetic magnetoresistors and flux guides). Other magnetic field sensors utilize optical, resonant, and superconducting properties.

In many Earth's field magnetic sensing applications, especially those involving compassing or orientation, it is extremely desirable to have three-axis sensing capability. In order to achieve low cost of such sensors, it is also desirable that the solution be a single chip or even fully integrable onto the accompanying application specific integrated circuit (ASIC) die. In handheld and miniaturized applications it is also critical to minimize power consumption in order to extend battery life.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a magnetic field sensor capable of sensing magnetic fields along one or more mutually exclusive sense axes, typically referred to as the X-axis, Y-axis, and Z-axis. More particularly, a unique sensor bridge design of magnetoresistive sense elements is implemented for each sense axis. Each sensor bridge incorporates an in-plane orientation of reference magnetization of the pinned layer. For each sensor bridge, one or more permanent magnet layers are strategically patterned (shape and position) to generate a unique external bias field vector of the sense magnetization of the sense layer to produce a balanced bridge configuration of magnetoresistive sense elements for the sensor bridge. Additionally, one sensor bridge design is utilized for sensing an external magnetic field that is perpendicular to the plane of the magnetic field sensor package without the use of flux concentrators. The strategically patterned permanent magnet layer(s) for this sensor bridge additionally allows it to respond to the out-of-plane external magnetic field without inter-axis coupling of sensor response. The various inventive concepts and principles embodied herein enable an ultra-low power, multiple sense axis magnetic field sensor without detrimental perming effects for improved sensitivity, reliability, and cost savings.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like may be used herein solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
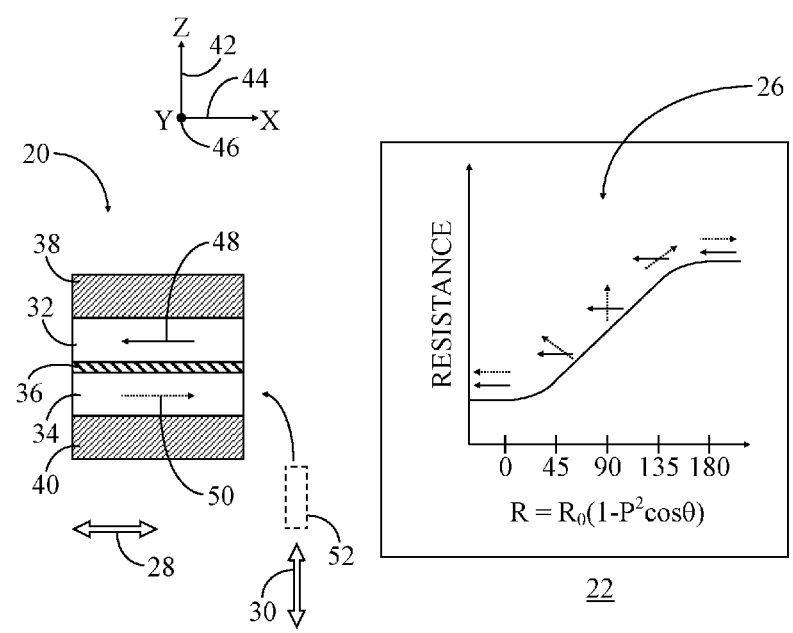
FIG. 1 shows a simplified side view of an exemplary magnetoresistive sense element with an accompanying plot of variable resistance that may occur in the presence of an external magnetic field.

Referring to FIG. 1, FIG. 1 shows a simplified side view of an exemplary magnetoresistive sense element 20 with an accompanying plot 22 of variable resistance 26 that may occur in the presence of an external magnetic field, represented by arrows 28, 30. More particularly, magnetoresistive sense element 20 may be a magnetic tunnel junction (MTJ) sensor. An MTJ structure includes a metal-insulator-metal layer sandwich in which the metal layers are ferromagnetic and the insulator layer is very thin. Electrically, this forms a tunnel diode in which electrons can tunnel from one ferromagnet into the other. Such a tunnel diode exhibits transport characteristics that depend, not only on the voltage bias, but also on the magnetic states of the top and bottom electrodes. Magnetoresistive sense element 20 is an exemplary magnetic tunnel junction (MTJ) structure that includes ferromagnetic layers 32, 34 separated by an insulator layer 36. An electrode 38 may be in electrical communication with ferromagnetic layer 32 and another electrode 40 may be in electrical communication with ferromagnetic layer 34. This structure may be formed within a dielectric material, not shown herein for simplicity.

In the side view illustration of FIG. 1, a Z-axis 42 is oriented up-and-down on the page, an X-axis 44 is oriented right-and-left on the page, and a Y-axis 46 is represented as a dot that depicts an axis going either into or out of the page on which FIG. 1 is situated. Thus, the X-Y plane in this side view illustration is oriented right-and-left and into or out of the page. Accordingly, external magnetic field 28 represents a magnetic field that is parallel to the X-Y plane of magnetoresistive sense element 20. More particularly, external magnetic field 28 is generally parallel to X-axis 44. Conversely, external magnetic field 30 represents a magnetic field that is perpendicular to the X-Y plane of magnetoresistive sense element 20. That is, external magnetic field is generally parallel to Z-axis 42.

Ferromagnetic layer 32 may be fixed, or "pinned," to have a reference magnetization, as represented by a solid arrow 48. Therefore, ferromagnetic layer 32 is referred to hereinafter as pinned layer 32. Ferromagnetic layer 34 is "free" to respond to, i.e., sense, the applied magnetic field (e.g., external magnetic field 38, 40) to provide a sense magnetization, represented by a dotted arrow 50. Sense magnetization 50 modulates the measured resistance 26. Accordingly, ferromagnetic layer 34 is referred to hereinafter as sense layer 34.

At a fixed voltage bias, resistance 26 depends upon the magnetic states of electrodes 38, 40. Since electrodes 38, 40 are electrically coupled with pinned and sense layers 32, 34, respectively, the states of electrodes 38, 40 depend upon the alignment of the magnetic moments of the pinned and sense layers 32, 34. By way of example and referring to plot 22, in the presence of X-axis external magnetic field 28, when the magnetic moments of pinned and sense layers 32, 34 are parallel (i.e., the vectors lie along parallel lines and point in the same direction) resistance 26 of the junction is lowest. However, resistance 26 of the junction is highest when the magnetic moments are anti-parallel (i.e., the vectors lie along parallel lines but point in the opposite direction). And in between, resistance 26 of the junction varies as the cosine of the angle between magnetic moments. One or more MTJ resistors, such as magnetoresistive sense element 20, may be utilized to form either of an X-axis or a Y-axis magnetic field sensor for sensing an external magnetic field that is parallel to the X-Y plane of magnetoresistive sense element 20.

In order to sense Z-axis magnetic field 30 in a direction perpendicular to the X-Y plane of magnetoresistive sense element 32, one or more flux guides 52 (one shown in dashed line form) are also formed within the dielectric material (not shown) in which magnetoresistive sense element 20 is formed. Per convention, flux guides 52 can be used to guide Z-axis magnetic field 30 into the X-Y plane. Flux guides 52 are generally thin, narrow sheets of magnetic material typically used to guide flux, i.e., Z-axis magnetic field 30, to a preferred location. With the use of flux guides 52 incorporated into, for example, a Z-axis magnetic field sensor, Z-axis magnetic field 30 is suitably guided so that it can be sensed using one or more in-plane magnetoresistive sense elements 20.

For optimal Z axis response, flux guides 52 have a preferred magnetization orientation. That is, the magnetic polarization for each of flux guides 52 will be directed in a uniform, i.e., generally single, direction. Unfortunately, flux guides 52 are susceptible to corruption by exposure to externally applied magnetic fields (e.g., disturbing fields of approximately one hundred Gauss or more). This corruption, typically referred to as perming, can alter the magnetic state of flux guides 52 leading to unstable device characteristics including offset, axis alignment, and noise. Large offset shifts, axis rotations, and excess noise can be very difficult or even impossible to compensate/calibrate out of the sensor response and can render Z-axis magnetic field sensor 20 unusable.

Figure 2:
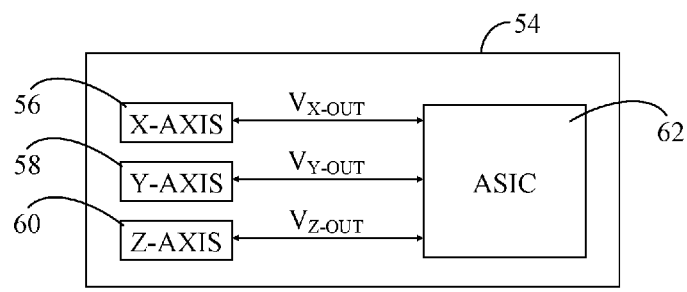
FIG. 2 shows a simplified block diagram of a magnetic field sensor package.

FIG. 2 shows a simplified block diagram of a magnetic field sensor package 54. Magnetic field sensor package 54 may be implemented in any device or system in which magnetic field sensing is required, for example, in compass, security, and military applications, in geophysics and space research applications, in biomagnetism and medical applications, and/or in non-destructive testing. In this example, sensor package 54 may be adapted to sense a magnetic field along three axes. Hence, sensor package 54 includes an X-axis magnetic field sensor 56, a Y-axis magnetic field sensor 58, and a Z-axis magnetic field sensor 60. Magnetic field sensors 56, 58, 60 may be coupled to, or otherwise in communication with, an application specific integrated circuit (ASIC) 62 to form sensor package 54. ASIC 62 performs some or all functions including, but not limited to, signal conditioning and data management, reset and stabilization control, bridge/output multiplexing, self-test, electrostatic discharge (ESD) protection, and so forth.

Figure 3:
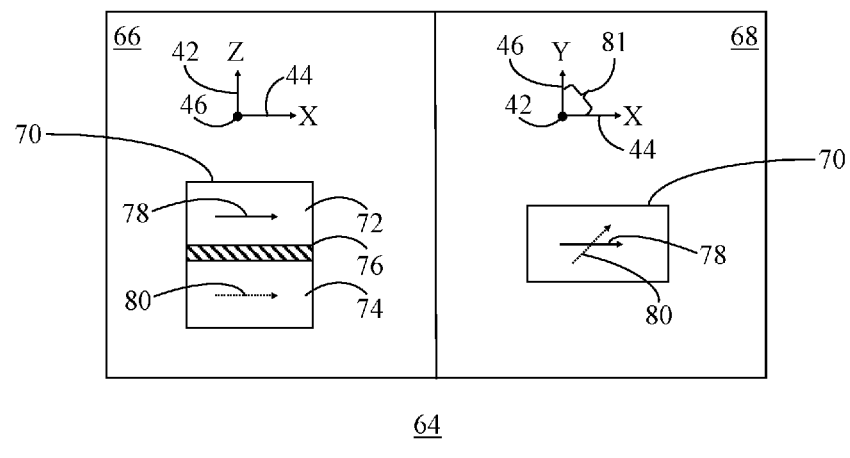
FIG. 3 shows a simplified schematic view of a magnetic field sensor having initial magnetic biasing.

FIG. 3 shows a simplified schematic view of a magnetoresistive sense element 64 having initial magnetic biasing. More particularly, FIG. 3 shows a simplified side view representation 66 and a simplified top view representation 68 of magnetoresistive sense element 64. In this example, magnetoresistive sense element 64 is an MTJ structure 70 having a pinned layer 72 and a sense layer 74 separated by an insulator layer 76. Pinned layer 72 of MTJ structure 70 may be fixed, or "pinned," to have a reference magnetization 78, as represented by a rightwardly directed solid arrow in each of side and top view representations 66, 68. Additionally, sense layer 76 of MTJ structure has initial magnetic biasing, referred to herein as a first sense magnetization 80, in an initial direction in the absence of an external magnetic field.

In this example, the initial direction of first sense magnetization 80, in the absence of an external magnetic field, is within an X-Y plane 81 of magnetoresistive sense element 64 that is defined by X-axis 44 and Y-axis 46. Thus, the initial direction of first sense magnetization 80 is an in-plane orientation relative to X-Y plane 81, as denoted in side view representation 66 with the horizontally oriented dotted arrow. However, the initial direction of first sense magnetization 80 may be skewed away from each of X-axis 44 and Y-axis 46 by an equivalent angular magnitude, for example, forty five degrees, as denoted in top view representation 68 by the skewed dotted arrow. This first sense magnetization 80 maybe referred to herein as a self-biased configuration of the sense layer and may be produced utilizing various fabrication techniques discussed in connection with FIG. 12.

Figure 4:
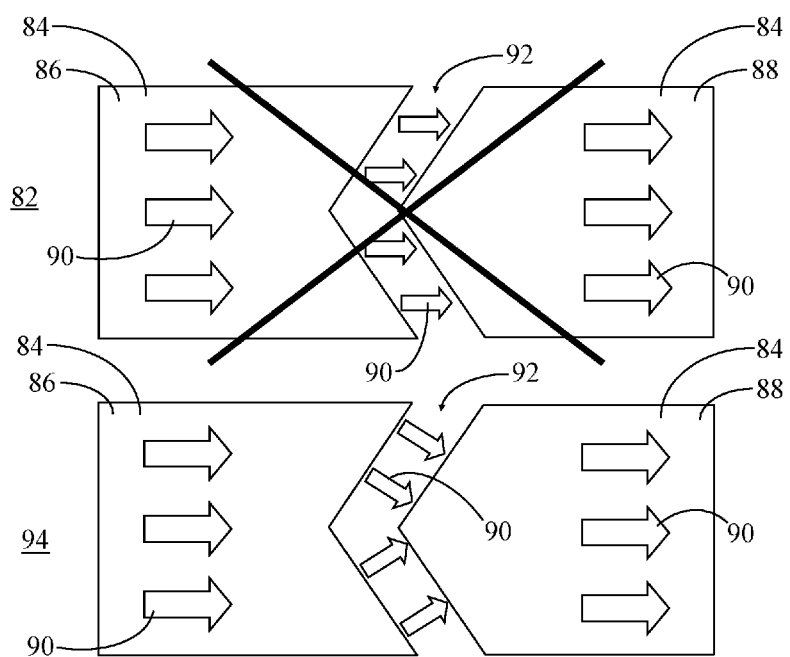
FIG. 4 shows a simplified plan view demonstrating the orientation of a magnetic field in a gap between segments of a permanent magnet.

FIG. 4 shows a simplified plan view demonstrating the orientation of a magnetic field between segments of a permanent magnet. In particular, FIG. 4 shows an example view 82 of a permanent magnet 84 having two segments 86, 88 demonstrating an inaccurate portrayal of a direction of a magnetic field 90 in a gap 92 between segments 86, 88. FIG. 4 further shows another example view 94 of permanent magnet 84 demonstrating an accurate portrayal of the direction of magnetic field 90 in gap 92 between segments 86, 88. In principle, if a linear gap (e.g., gap 92) is patterned or formed through a layer of permanent magnet material (e.g., permanent magnet 84) that is magnetized in a specific direction, magnetic field 90 within gap 92 does not follow the direction of magnetic field 90 within segment 86, 88 of permanent magnet 84. This is shown in example view 82 by an "X" drawn through the illustration. Instead, magnetic field 90 within gap 92 is normal to the direction of gap, as shown in example view 94.

As will be discussed in significantly greater detail below, magnetic field sensor package 54 employs a triad of unique sensor bridge designs for X-axis 44, Y-axis 46, and Z-axis 42 magnetic field sensing using magnetoresistive sense elements, such as MTJ structures. Each sensor bridge incorporates an in-plane orientation of reference magnetization of the pinned layer. For each sensor bridge, one or more permanent magnet layers are strategically patterned (shape and position) to magnetically bias the initial, or first sense magnetization 80 (FIG. 3) of the sense layer of particular ones of the magnetoresistive sense elements in order to generate a unique external bias field vector of the sense magnetization of the sense layer. By capitalizing on the principle discussed above in connection with FIG. 4, suitable biasing of the sense/free layer can be performed in different directions by placing the magnetoresistive sense elements within gaps between segments of the permanent magnet layer, in which the gaps are oriented at specific angles with respect to the sense layer. Accordingly, orthogonal bias fields can be created within different sensor bridges to enable X-axis and Y-axis sensor bridges. Furthermore, the strategically patterned permanent magnet layer(s) for a Z-axis sensor bridge design allows it to respond to the out-of-plane external magnetic field without the use of flux concentrators and with little or no inter-axis coupling of sensor response.

Figure 5:
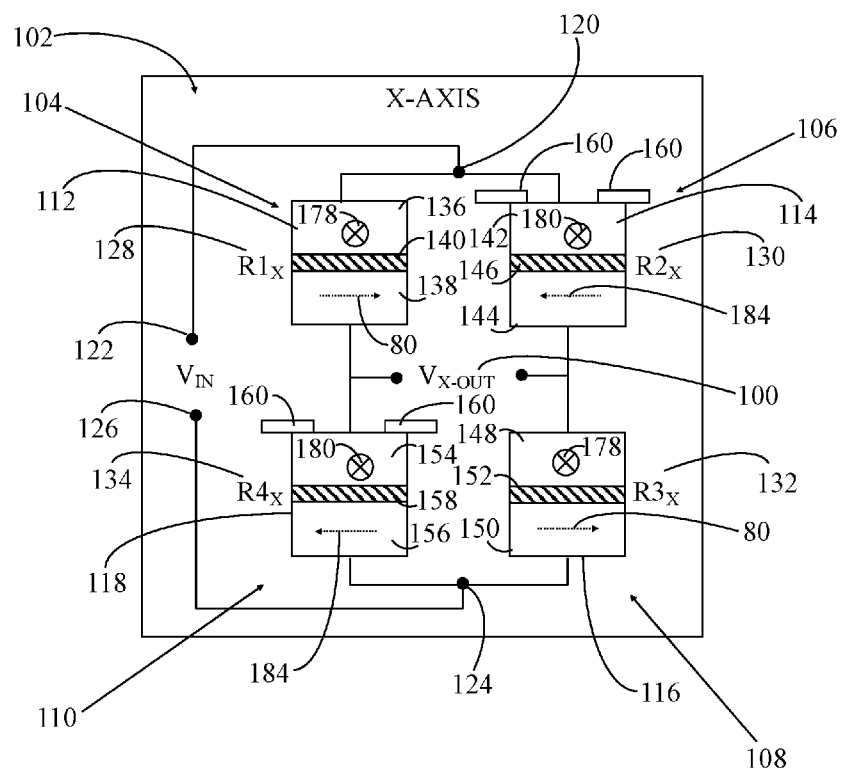
FIG. 5 shows a simplified schematic view of an X-axis magnetic field sensor of the magnetic field sensor package of FIG. 2.

Now referring to FIG. 5, FIG. 5 shows a simplified schematic view of X-axis magnetic field sensor 56 of magnetic field sensor package 54 (FIG. 2). Accordingly, X-axis magnetic field sensor 56 is sensitive to X-axis external magnetic field 28 in a sensing direction (referred to herein as X sensing direction 96) parallel to X-axis 44 and therefore parallel to an X-Y plane 81 (see FIG. 6) of magnetic field sensor package 54 (FIG. 2). X-axis magnetic field sensor 56 produces an output signal 100, labeled $V_{X\text{-}OUT}$, indicative of the magnitude of X-axis external magnetic field 28.

X-axis magnetic field sensor 56 includes a sensor bridge, and more particularly, a Wheatstone bridge, referred to herein as an X-axis Wheatstone bridge 102. Thus, X-axis magnetic field sensor 56 includes first, second, third, and fourth sensor legs 104, 106, 108, 110, respectively. First sensor leg 104 includes one or more first magnetoresistive sense elements 112, second sensor leg 106 includes one or more second magnetoresistive sense elements 114, third sensor leg 108 includes one or more third magnetoresistive sense elements 116, and fourth sensor leg 110 includes one or more fourth magnetoresistive sense elements 118. In an embodiment, magnetoresistive sense elements 112, 114, 116, 118 may be MTJ structures. Only one each of magnetoresistive sense elements 112, 114, 116, 118 is shown for simplicity of illustration. Those skilled in the art will readily recognize that X-axis magnetic field sensor 56 can include any number of magnetoresistive sense elements 112, 114, 116, 118.

First and fourth magnetoresistive sense elements 112, 118 are coupled in series to form a first half of X-axis Wheatstone bridge 102 and second and third magnetoresistive sense elements 114, 116 are coupled in series to form a second half of X-axis Wheatstone bridge 102. Thus, the first half of X-axis Wheatstone bridge 102 is coupled in parallel with the second half of X-axis Wheatstone bridge 102 such that a junction 120 of first and second magnetoresistive sense elements 112, 114 forms a first input terminal 122 and a junction 124 of third and fourth magnetoresistive sense elements 116, 118 forms a second input terminal 126. Thus, $V_{X\text{-}OUT}$ 100 is between midpoints of the series combination of first and fourth magnetoresistive sense elements 112, 118 and second and third magnetoresistive sense elements 114, 116.

For illustrative purposes, resistances are provided in association with magnetoresistive sense elements 112, 114, 116, 118. In this example, a resistance 128, $R1_X$, represents the signal output of first magnetoresistive sense element 112. A resistance 130, $R2_X$, represents the signal output of second magnetoresistive sense element 114. A resistance 132, $R3_X$, represents the signal output of third magnetoresistive sense element 116. And, a resistance 134, $R4_X$, represents the signal output of fourth magnetoresistive sense element 118.

First magnetoresistive sense element 112 includes a first pinned layer 136 and a first sense layer 138 separated by an insulator layer 140. Similarly, second magnetoresistive sense element 114 includes a second pinned layer 142 and a second sense layer 144 separated by an insulator layer 146. Third magnetoresistive sense element 116 includes a third pinned layer 148 and a third sense layer 150 separated by an insulator layer 152. Fourth magnetoresistive sense element 118 includes a fourth pinned layer 154 and a fourth sense layer 156 separated by an insulator layer 158.

Additionally, X-axis magnetic sensor 56 includes a permanent magnet layer 160 positioned proximate each of second and fourth magnetoresistive sense elements 114, 118. As will be discussed below, permanent magnet layer 160 magnetically biases the initial sense magnetization, i.e., first sense magnetization 80 (FIG. 3), of second and fourth sense layers 144, 156 of magnetoresistive sense elements 114, 118. However, first and third sense layers 138, 148 of first and third magnetoresistive sense elements 112, 116 are not magnetic biased by permanent magnet layer 160 so that they retain the initial sense magnetization, i.e., first sense magnetization 80. In order to enable the suitable magnetic biasing and to concurrently enable efficiency in fabrication, permanent magnet layer 160 has a single magnetic orientation and a single thickness. In this illustration, permanent magnet layer 160 is located out-of-plane from magnetoresistive sense elements 114, 118. For example, permanent magnet layer 160 is located out-of-plane above magnetoresistive sense elements 114, 118. A single layer, vertical permanent magnet biasing configuration is described herein for illustrative purposes. In other embodiments, permanent magnet layer 160 may be generally in-plane with magnetoresistive sense elements 114, 118. Further, although one permanent magnet layer 160 is shown, alternative embodiments may include two or more permanent magnet layers in an out-of-plane or in-plane configuration.

Figure 6:
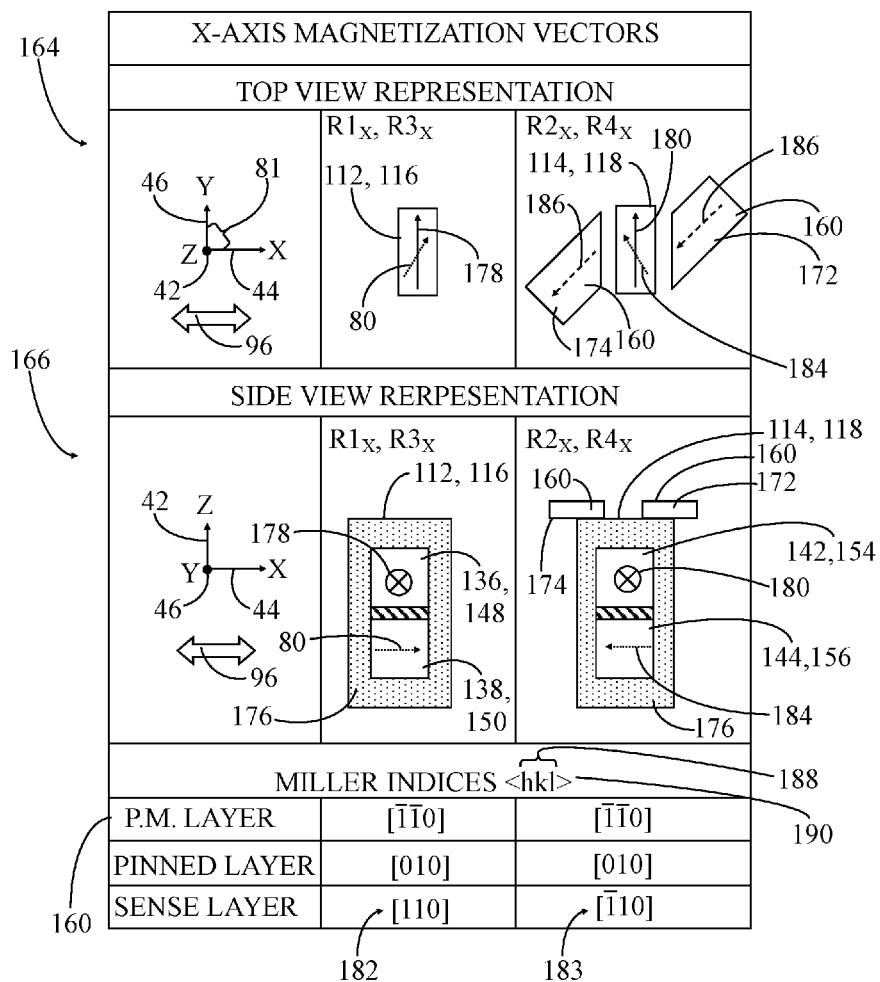
FIG. 6 shows a table demonstrating magnetization vectors of the X-axis magnetic field sensor.

Referring concurrently to FIGS. 5 and 6, FIG. 6 shows a table 162 demonstrating magnetization vectors of X-axis magnetic field sensor 56. More particularly, table 162 provides a top view representation 164 of magnetoresistive sense elements 112, 114, 116, 118 and a side view representation 166 of magnetoresistive sense elements 112, 114, 116, 118. Top view representation 164 includes a symbol representing top views of first and third magnetoresistive sense elements 112, 116 and another symbol representing top views of second and fourth magnetoresistive sense elements 114, 118 with segments 172, 174 of permanent magnet layer 160. Side view representation 166 provides a symbol representing side views of first and third magnetoresistive sense elements 112, 116 and another symbol representing side views of second and fourth magnetoresistive sense elements 114, 118. A dielectric material 176 surrounds magnetoresistive sense elements 112, 114, 116, 118. Dielectric material 176 is included with the side views representing first and third magnetoresistive sense elements 112, 116 as well as second and fourth magnetoresistive sense elements 114, 118 to illustrate an out-of-plane location of permanent magnet layer 160 above magnetoresistive sense elements 114, 118.

Each of first and third pinned layers 136, 148 has a first reference magnetization 178 and each of second and fourth pinned layers 142, 154 has a second reference magnetization 180, each of which is oriented substantially parallel to X-Y plane 81. In some embodiments, each of first and second reference magnetizations 178, 180 may be oriented parallel to Y-axis 46, and therefore perpendicular to X sensing direction 96. Additionally, second reference magnetization 180 of second and fourth pinned layers 142, 154 is oriented in the same direction as first reference magnetization 178 of first and third pinned layers 136, 148. Thus, as shown in FIG. 5 and side view representation 166 of FIG. 6, first and second reference magnetizations 178, 180 are represented by circles with an inscribed X, denoting a direction going into the page. Additionally, in top view representation of FIG. 6, first and second reference magnetizations 178, 180 are represented by solid arrows directed upwardly on the page aligned with Y-axis 46.

Each of sense layers 138, 144, 150, 156 of magnetoresistive sense elements 112, 114, 116, 118 has an initial (i.e., self-biased) magnetic orientation, i.e., first sense magnetization 80. In accordance with an embodiment, permanent magnet layer 160 magnetically biases second and fourth sense layers 144, 156 to produce a second sense magnetization 184. First sense magnetization 80 is oriented in a first direction, referred to herein as a first in-plane orientation, relative to X-Y plane 81. In addition, second sense magnetization 184 is oriented in a second direction, referred to herein as a second in-plane orientation relative to X-Y plane 81. Both of the first and second in-plane orientations within X-Y plane 81 are skewed away from each of X-axis 44 and Y-axis 46. However, the first and second in-plane orientations differ from one another. Thus in FIG. 5 and side view representation 166 of FIG. 6, first sense magnetization 80 is represented by a rightwardly directed dotted arrow and second sense magnetization 184 is represented by a leftwardly directed dotted arrow. Additionally, in top view representation 164 of FIG. 6, first sense magnetization 80 is represented by a rightwardly and upwardly directed arrow that is skewed away from both X-axis 44 and Y-axis 46 and second sense magnetization 184 is represented by a leftwardly and upwardly directed arrow that is skewed away from both X-axis 44 and Y-axis 46. In general, first and second sense magnetizations 80, 184 are orientable in response to X magnetic field 28 in X sensing direction 96.

In order to achieve the particular orientation of second sense magnetization 184, the direction or orientation of the magnetization of segments 172, 174 of permanent magnet layer 160 may be skewed away from both of X-axis 44 and Y-axis 46 within X-Y plane 81 by an equivalent angular magnitude, e.g., forty-five degrees. A direction or orientation of the magnetization of segments 172, 174 of permanent magnet layer 160 is represented by a dashed line arrow 186 in top view representation 164. A single magnetization direction 186 of permanent magnet layer 160, as well as the location and geometry of the various segments of permanent magnet layer 160, is useful in achieving the three-axis sensing capability of magnetic field sensor package 54 (FIG. 2), as will be discussed in connection with FIG. 11

In order to better appreciate these various directions of magnetization direction 186 of permanent magnet layer 186, first and second reference magnetizations 178, 180, and first and second sense magnetizations 80, 184, their orientations are defined herein by Miller indices. Miller indices are a notation system typically used to specify directions and planes. For example, they can be used to specify a direction of a vector, r, from the origin to a point. Typically, the notation [hkl] represents the direction, where the Miller indices h, k, and l are replaced by three integers, and the notation <hkl> represents a family of directions. A negative direction is denoted with a bar on top of one or more of the three integers. In a cubic system, each of the directions in a family of directions has the same indices regardless of order or sign.

Utilizing the Miller index notation system, where h, k, and l are Miller indices 188 and <hkl> represents a family of directions 190, magnetization direction 186 of segments 172, 174 of permanent magnet layer 160 is oriented in a single direction, which may be characterized by Miller indices 188 of [$\bar{1}\bar{1}0$]. Accordingly, magnetization direction 186 is characterized by a single magnetization orientation within X-Y plane that is skewed in a negative direction away from both X- and Y-axes 44, 46 by the same angular magnitude.

The orientation, or direction, of first reference magnetization 178 for first and third pinned layers 136, 148 of first and third magnetoresistive sense elements 112, 116 can be characterized by Miller indices of [010]. Likewise, the orientation, or direction, of second reference magnetization 180 for second and fourth pinned layers 142, 154 of second and fourth magnetoresistive sense elements 114, 118 can be characterized by the same Miller indices of [010]. Thus, first and second reference magnetizations 178, 180 are oriented parallel to Y-axis 46, and in the same direction.

In the absence of an external magnetic field (e.g., X magnetic field 28), first and third sense layers 138, 150 retain first sense magnetization 80. Thus, utilizing the Miller index notation system, a first in-plane orientation 182 of first sense magnetization 80 for first and third sense layers 138, 150 of first and third magnetoresistive sense elements 112, 116 can be characterized by Miller indices 188 of [110]. However, in the absence of an external magnetic field, segments 172, 174 of permanent magnet layer 160 positioned proximate second and fourth magnetoresistive sense elements 114, 118 magnetically bias first magnetization 80 of second and fourth sense layers 144, 156 to produce second sense magnetization 184 in different direction. Thus, utilizing the Miller index notation system, a second in-plane orientation 183 of second sense magnetization 184 for second and fourth sense layers 144, 156 of second and fourth magnetoresistive sense elements 114, 118 can be characterized by Miller indices 188 of [T10].

Figure 7:
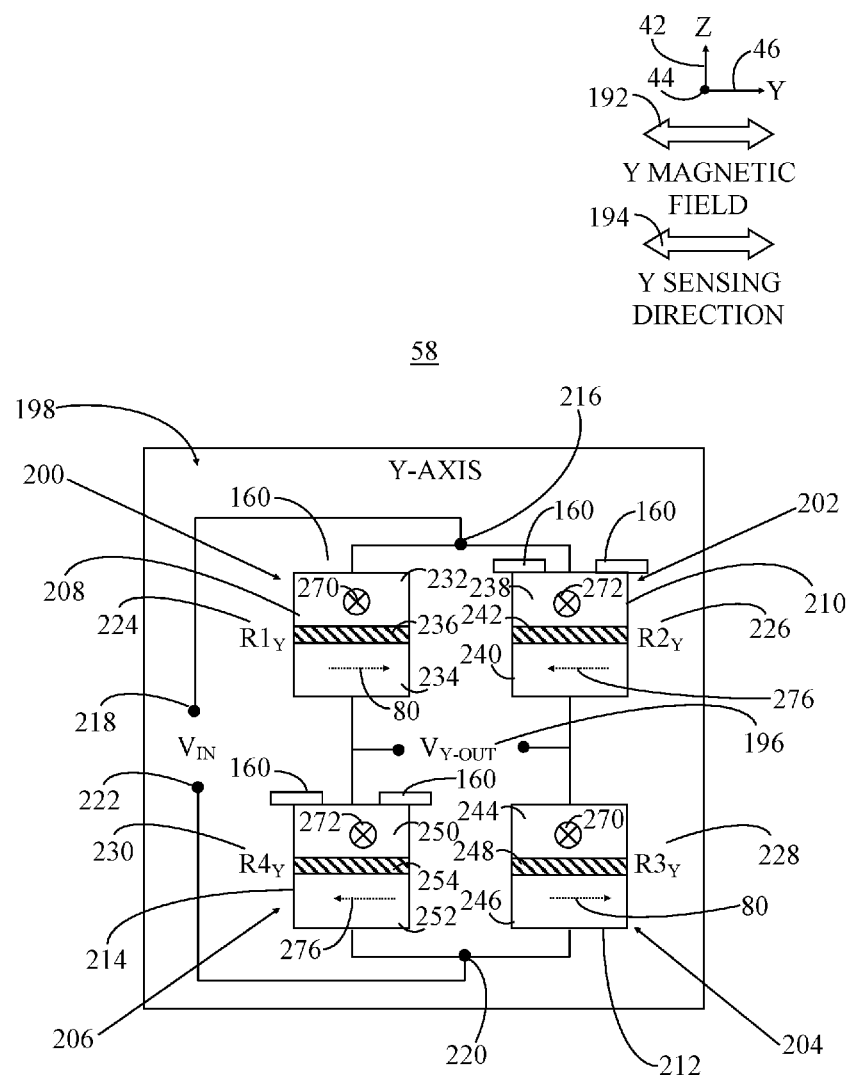
FIG. 7 shows a simplified schematic view of a Y-axis magnetic field sensor of the magnetic field sensor package of FIG. 2.

Now referring to FIG. 7, FIG. 7 shows a simplified schematic view of Y-axis magnetic field sensor 58 of magnetic field sensor package 54 (FIG. 2). Accordingly, Y-axis magnetic field sensor 58 is sensitive to a Y-axis external magnetic field 192 in a sensing direction (referred to herein as Y sensing direction 194) parallel to Y-axis 46 and therefore parallel to an X-Y plane 81 (see FIG. 8) of magnetic field sensor package 54 (FIG. 2). Y-axis magnetic field sensor 58 produces an output signal 196, labeled $V_{Y-OUT}$, indicative of the magnitude of Y-axis external magnetic field 192.

Y-axis magnetic field sensor 58 includes a sensor bridge, and more particularly, a Wheatstone bridge, referred to herein as a Y-axis Wheatstone bridge 198. Thus, Y-axis magnetic field sensor 58 includes first, second, third, and fourth sensor legs 200, 202, 204, 206, respectively. First sensor leg 200 includes one or more first magnetoresistive sense elements 208, second sensor leg 202 includes one or more second magnetoresistive sense elements 210, third sensor leg 204 includes one or more third magnetoresistive sense elements 212 and fourth sensor leg 206 includes one or more fourth magnetoresistive sense elements 214. Only one each of magnetoresistive sense elements 208, 210, 212, 214 is shown for simplicity of illustration. Those skilled in the art will readily recognize that Y-axis magnetic field sensor 58 can include any number of magnetoresistive sense elements 208, 210, 212, 214.

First and fourth magnetoresistive sense elements 208, 214 are coupled in series to form a first half of Y-axis Wheatstone bridge 198 and second and third magnetoresistive sense elements 210, 212 are coupled in series to form a second half of Y-axis Wheatstone bridge 198. Thus, the first half of Y-axis Wheatstone bridge 198 is coupled in parallel with the second half of Y-axis Wheatstone bridge 198 such that a junction 216 of first and second magnetoresistive sense elements 208, 210 forms a first input terminal 218 and a junction 220 of third and fourth magnetoresistive sense elements 212, 214 forms a second input terminal 222. Thus, $V^{Y-OUT}$ 196 is between midpoints of the series combination of first and fourth magnetoresistive sense elements 208, 214 and second and third magnetoresistive sense elements 210, 212.

For illustrative purposes, resistances are provided in association with magnetoresistive sense elements 208, 210, 212, 214. In this example, a resistance 224, $R1_Y$, represents the signal output of first magnetoresistive sense element 208. A resistance 226, $R2^Y$, represents the signal output of second magnetoresistive sense element 210. A resistance 228, $R3_Y$, represents the signal output of third magnetoresistive sense element 212. And, a resistance 230, $R4_Y$, represents the signal output of fourth magnetoresistive sense element 214.

First magnetoresistive sense element 208 includes a first pinned layer 232 and a first sense layer 234 separated by an insulator layer 236. Similarly, second magnetoresistive sense element 210 includes a second pinned layer 238 and a second sense layer 240 separated by an insulator layer 242. Third magnetoresistive sense element 212 includes a third pinned layer 244 and a third sense layer 246 separated by an insulator layer 248. Fourth magnetoresistive sense element 214 includes a fourth pinned layer 250 and a fourth sense layer 252 separated by an insulator layer 254.

Additionally, Y-axis magnetic sensor 58 includes permanent magnet layer 160 positioned proximate each of second and fourth magnetoresistive sense elements 210, 214. Permanent magnet layer 160 magnetically biases first sense magnetization 80 (FIG. 3) of second and fourth sense layers 240, 252 of second and fourth magnetoresistive sense elements 210, 214 to produce a second reference magnetization 272. Like X-axis magnetic sensor 56 (FIG. 5), permanent magnet layer 160 is located out-of-plane above magnetoresistive sense elements 210, 214.

Figure 8:
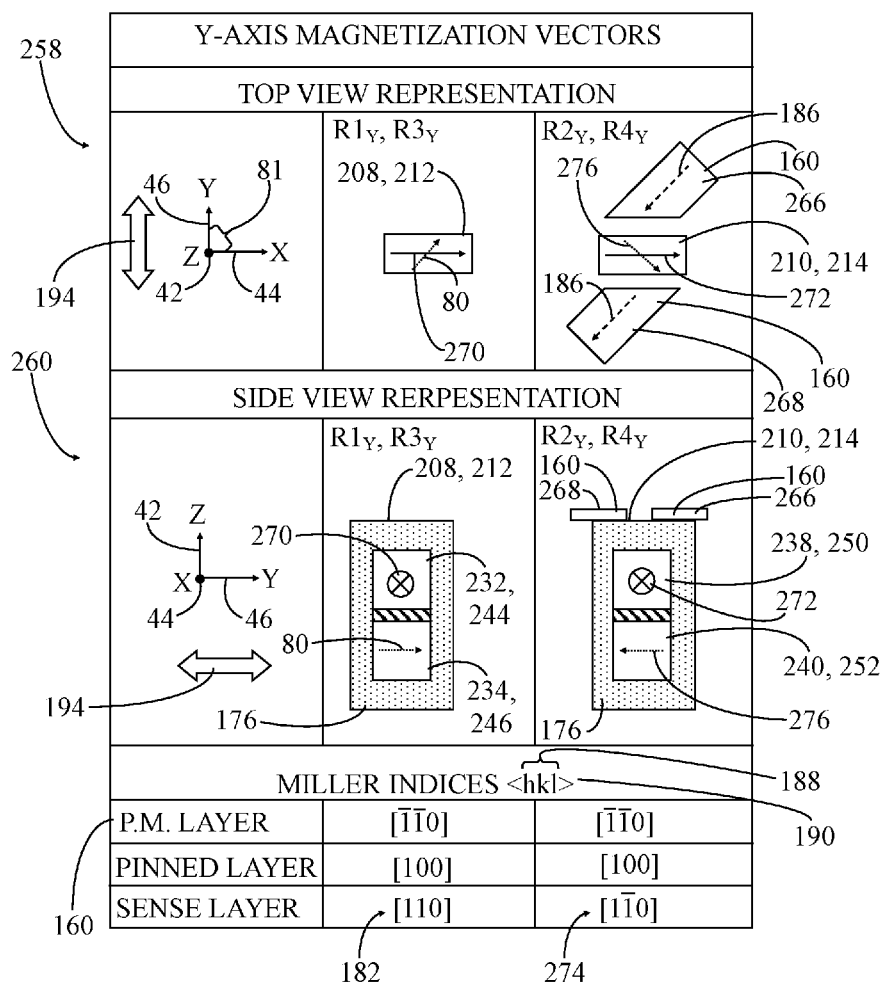
FIG. 8 shows a table demonstrating magnetization vectors of the Y-axis magnetic field sensor.

Referring concurrently to FIGS. 7 and 8, FIG. 8 shows a table 256 demonstrating magnetization vectors of Y-axis magnetic field sensor 58. More particularly, table 256 provides a top view representation 258 of magnetoresistive sense elements 208, 210, 212, 214 and a side view representation 260 of magnetoresistive sense elements 208, 210, 212, 214. Top view representation 258 includes a symbol representing top views of first and third magnetoresistive sense elements 208, 212 and another symbol representing top views of second and fourth magnetoresistive sense elements 210, 214 with segments 266, 268 of permanent magnet layer 160. Side view representation 260 provides a symbol representing side views of first and third magnetoresistive sense elements 208, 212 and another symbol representing side views of second and fourth magnetoresistive sense elements 210, 214. Dielectric material 176 surrounds magnetoresistive sense elements 208, 210, 212, 214.

Each of first and third pinned layers 232, 244 has a first reference magnetization 270 and each of second and fourth pinned layers 238, 250 has a second reference magnetization 272, each of which is oriented substantially parallel to X-Y plane 81. In some embodiments, each of first and second reference magnetizations 270, 272 may be oriented parallel to X-axis 44, and therefore perpendicular to Y sensing direction 194. Additionally, second reference magnetization 272 of second and fourth pinned layers 238, 250 is oriented in the same direction relative as first reference magnetization 270 of first and third pinned layers 232, 244. Thus, as shown in FIG. 7 and side view representation 260 of FIG. 8, first and second reference magnetizations 270, 272 are represented by circles with an inscribed X, denoting a direction going into the page. Additionally, in top view representation 258 of FIG. 8, first and second reference magnetizations 270, 272 are represented by solid arrows directed rightwardly on the page aligned with X-axis 44.

Each of sense layers 234, 240, 246, 252 of magnetoresistive sense elements 208, 210, 212, 214 has an initial (i.e., self-biased) magnetic orientation, i.e., first sense magnetization 80. However, in accordance with an embodiment, permanent magnet layer 160 magnetically biases second and fourth sense layers 240, 252 to have a second sense magnetization 276. As shown, first sense magnetization 80 is oriented in first in-plane orientation 182 relative to X-Y plane 81. In addition, second sense magnetization 276 is oriented in another direction, referred to herein as a second in-plane orientation 274 relative to X-Y plane 81. Like first in-plane orientation 182, second in-plane orientation 274 is skewed away from each of X-axis 44 and Y-axis 46 and it differs from first in-plane orientation 182. Thus, in FIG. 7 and side view representation 260 of FIG. 8, first sense magnetization 80 is represented by a rightwardly directed dotted arrow and second sense magnetization 276 is represented by a leftwardly directed dotted arrow. Additionally in top view representation 258 of FIG. 8, first sense magnetization 80 is represented by a rightwardly and upwardly directed dotted arrow that is skewed away from both X-axis 44 and Y-axis 46 and second sense magnetization 276 is represented by a rightwardly and downwardly directed dotted arrow that is skewed away from both of X-axis 44 and Y-axis 46. In general, first and second sense magnetizations 80, 276 are orientable in response to Y magnetic field 192 in Y sensing direction 194.

In order to achieve the particular orientation of second sense magnetization 276, the direction or orientation of the magnetization of segments 266, 268 of permanent magnet layer 160 are again skewed away from both of X-axis 44 and Y-axis 46 within X-Y plane 81 by an equivalent angular magnitude, e.g., forty-five degrees. Magnetization direction 186 of segments 266, 268 of permanent magnet layer 160 is again represented by a dashed line arrow 186 in top view representation 258. Again, the single magnetization direction 186 of permanent magnet layer 160, as well as the location and geometry of the various segments of permanent magnet layer 160, achieves the three-axis sensing capability of magnetic field sensor package 54 (FIG. 2), as will be discussed in connection with FIG. 11.

Utilizing the Miller index notation system, magnetization direction 186 of segments 266, 268 of permanent magnet layer 160 may be characterized by Miller indices 188 of [$\bar{1}\bar{1}0$] denoting that magnetization direction 186 is skewed in a negative direction away from both X- and Y-axes 44, 46 within X-Y plane 81 by the same angular magnitude. The orientation, or direction, of first reference magnetization 270 for first and third pinned layers 232, 244 of first and third magnetoresistive sense elements 208, 212 can be characterized by Miller indices 188 of [100]. Likewise, the orientation, or direction, of second reference magnetization 272 of second and fourth pinned layers 238, 250 of second and fourth magnetoresistive sense elements 210, 214 can be characterized by Miller indices 188 of [100]. Thus, first and second reference magnetizations 270, 272 are oriented parallel to X-axis 46, and in the same direction.

In the absence of an external magnetic field (e.g., Y magnetic field 194), first and third sense layers 234, 246 of first and third magnetoresistive sense elements 208, 212 retain first sense magnetization 80. Utilizing the Miller index notation system, first in-plane orientation 182 of first sense magnetization 80 for first and third sense layers 234, 236 of first and third magnetoresistive sense elements 208, 212 can be characterized by Miller indices 188 of [110]. However, in the absence of an external magnetic field, segments 266, 268 of permanent magnet layer 160 positioned proximate second and fourth magnetoresistive sense elements 210, 214 magnetically bias first sense magnetization 80 of second and fourth sense layers 144, 156 to produce second sense magnetization 276 in a different direction. Thus, utilizing the Miller index notation system, a second in-plane orientation 274 of second sense magnetization 276 for second and fourth sense layers 240, 252 of second and fourth magnetoresistive sense elements 210, 214 can be characterized by Miller indices 188 of each of first and second sense magnetizations 182, 184 can be characterized by Miller indices 188 of [1$\bar{1}$0].

Figure 9:
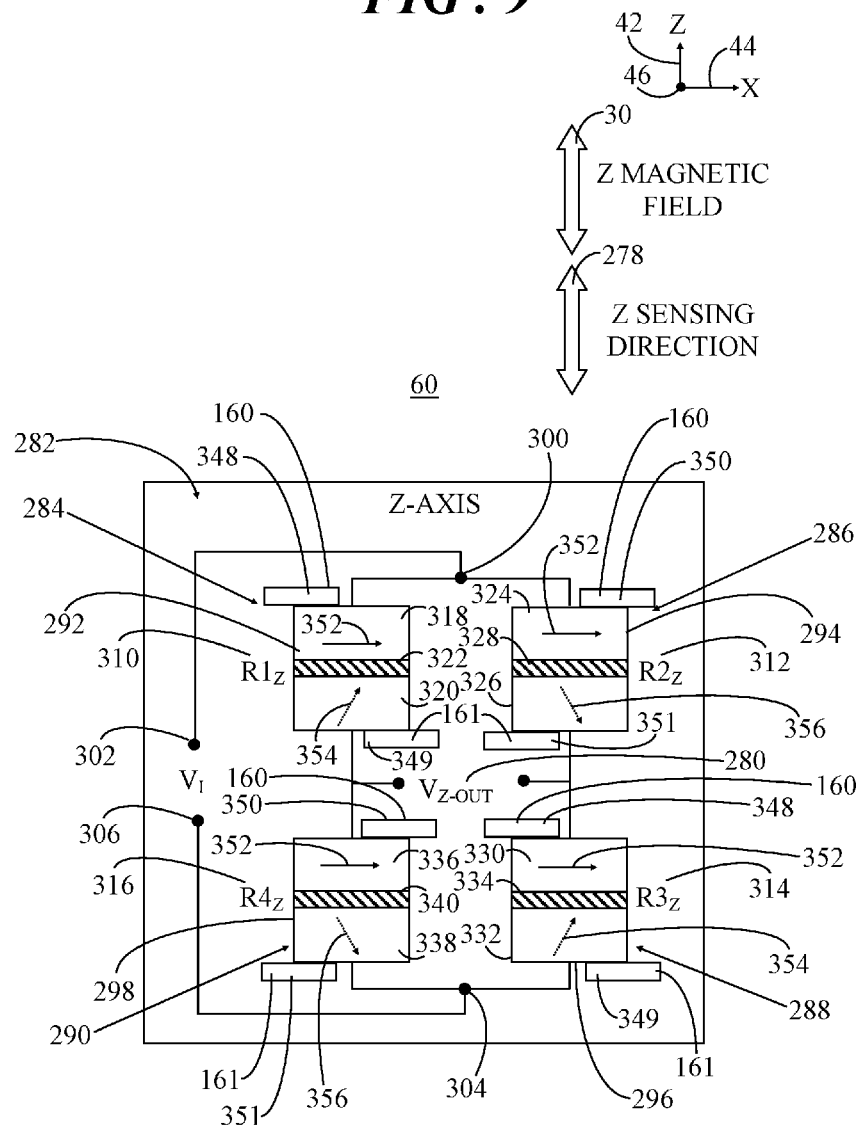
FIG. 9 shows a simplified schematic view of a Z-axis magnetic field sensor of the magnetic field sensor package of FIG. 2.

Now referring to FIG. 9, FIG. 9 shows a simplified schematic view of Z-axis magnetic field sensor 60 of magnetic field sensor package 54 (FIG. 2). Accordingly, Z-axis magnetic field sensor 60 is sensitive to Z-axis external magnetic field 30 in a sensing direction (referred to herein as a Z sensing direction 278) parallel to Z-axis 42 and therefore perpendicular to X-Y plane 81 (see FIG. 10) of magnetic field sensor package 54. Z-axis magnetic field sensor 60 produces an output signal 280, labeled $V_{Z-OUT}$, indicative of the magnitude of Z-axis external magnetic field 30.

Z-axis magnetic field sensor 60 includes a sensor bridge, and more particularly, a Wheatstone bridge, referred to herein as a Z-axis Wheatstone bridge 282. Thus, Z-axis magnetic field sensor 60 includes first, second, third, and fourth sensor legs 284, 286, 288, 290, respectively. First sensor leg 284 includes one or more first magnetoresistive sense elements 292, second sensor leg 286 includes one or more second magnetoresistive sense elements 294, third sensor leg 288 includes one or more third magnetoresistive sense elements 296, and fourth sensor leg 290 includes one or more fourth magnetoresistive sense elements 298. Only one each of magnetoresistive sense elements 292, 294, 296, 298 is shown for simplicity of illustration. Those skilled in the art will readily recognize that Z-axis magnetic field sensor 60 can include any number of magnetoresistive sense elements 292, 294, 296, 298.

First and fourth magnetoresistive sense elements 292, 298 are coupled in series to form a first half of Z-axis Wheatstone bridge 282 and second and third magnetoresistive sense elements 294, 296 are coupled in series to form a second half of Z-axis Wheatstone bridge 282. Thus, the first half of Z-axis Wheatstone bridge 282 is coupled in parallel with the second half of Z-axis Wheatstone bridge 282 such that a junction 300 of first and second magnetoresistive sense elements 292, 294 forms a first input terminal 302 and a junction 304 of third and fourth magnetoresistive sense elements 296, 298 forms a second input terminal 306. Thus, $V_{Z-OUT}$ 280 is between midpoints of the series combination of first and fourth magnetoresistive sense elements 292, 298 and second and third magnetoresistive sense elements 294, 296.

For illustrative purposes, resistances are provided in association with magnetoresistive sense elements 292, 294, 296, 298. In this example, a resistance 310, $R1_Z$, represents the signal output of first magnetoresistive sense element 292. A resistance 312, $R2_Z$, represents the signal output of second magnetoresistive sense element 294. A resistance 314, $R3_Z$, represents the signal output of third magnetoresistive sense element 296. And, a resistance 316, $R4_Z$, represents the signal output of fourth magnetoresistive sense element 298.

First magnetoresistive sense element 292 includes a first pinned layer 318 and a first sense layer 320 separated by an insulator layer 322. Similarly, second magnetoresistive sense element 294 includes a second pinned layer 324 and a second sense layer 326 separated by an insulator layer 328. Third magnetoresistive sense element 296 includes a third pinned layer 330 and a third sense layer 332 separated by an insulator layer 334. Fourth magnetoresistive sense element 298 includes a fourth pinned layer 336 and a fourth sense layer 338 separated by an insulator layer 340.

A single layer, horizontal permanent magnet biasing configuration was described in connection with X-axis magnetic field sensor 56 (FIG. 5) Y-axis magnetic field sensor 58 (FIG. 7) for illustrative purposes. However, as mentioned above, alternative embodiments may include two or more permanent magnet layers in an out-of-plane or in-plane configuration. Thus, for illustrative purposes, Z-axis magnetic sensor 60 includes two permanent magnet layers, i.e., permanent magnet layer 160 and a permanent magnet layer 161, positioned proximate each of first, second, third, and fourth magnetoresistive sense elements 292, 294, 296, 298. Like X-axis and Y-axis magnetic sensors 56, 58 (FIGS. 5 and 7), permanent magnet layer 160 is located out-of-plane above magnetoresistive sense elements 292, 294, 296, 298. However, permanent magnet layer 161 is located out-of-plane below magnetoresistive sense elements 292, 294, 296, 298.

Figure 10:
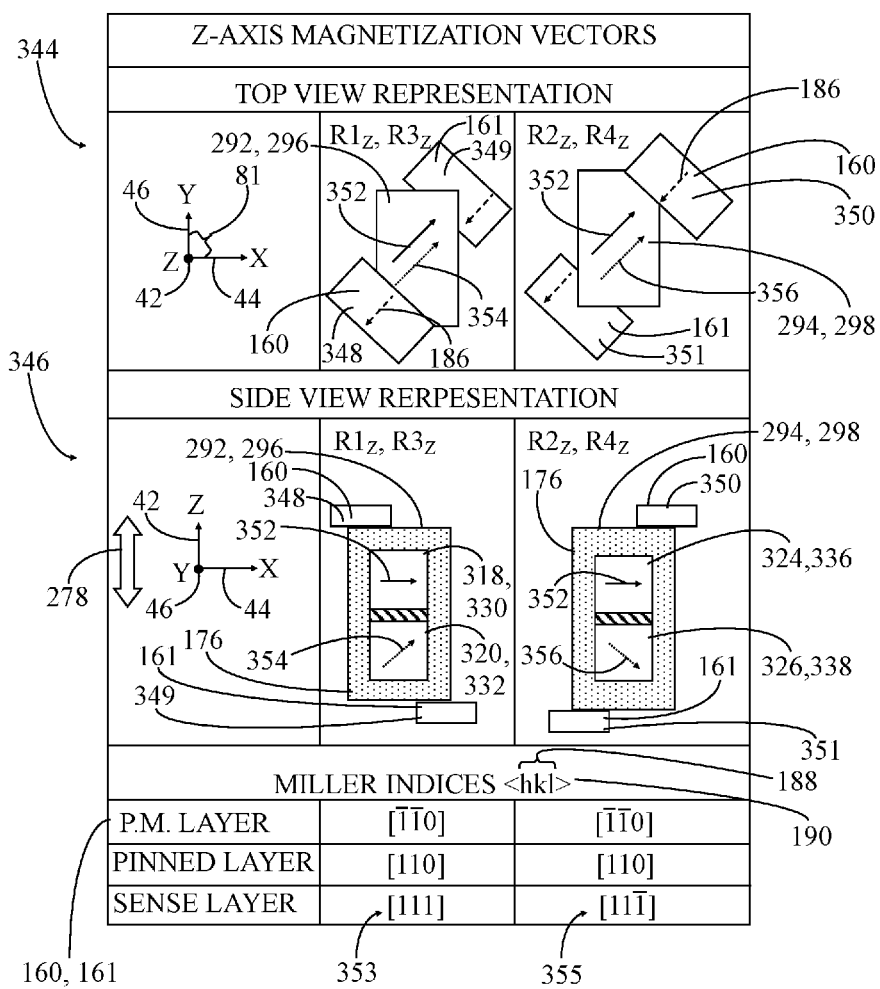
FIG. 10 shows a table demonstrating magnetization vectors of the Z-axis magnetic field.

Referring concurrently to FIGS. 9 and 10, FIG. 10 shows a table 342 demonstrating magnetization vectors of Z-axis magnetic field sensor 60. More particularly, table 342 provides a top view representation 344 of magnetoresistive sense elements 292, 294, 296, 298 and a side view representation 346 of magnetoresistive sense elements 292, 294, 296, 298. Top view representation 344 includes a symbol representing top views of first and third magnetoresistive sense elements 292, 296 with segments 348 of permanent magnet layer 160 overlying (in this example illustration) first and third magnetoresistive sense elements 292, 296 and segments 349 of permanent magnet layer 161 underlying (in this example illustration) first and third magnetoresistive sense elements 292, 296. Additionally, top view representation 344 includes another symbol representing top views of second and fourth magnetoresistive sense elements 294, 298 with segments 350 of permanent magnet layer 160 overlying (in this example illustration) second and fourth magnetoresistive sense elements 294, 298 and segments 351 of permanent magnet layer 161 underlying (in this example illustration) second and fourth magnetoresistive sense elements 294, 298. Side view representation 346 provides a symbol representing side views of first and third magnetoresistive sense elements 292, 296 and another symbol representing side views of second and fourth magnetoresistive sense elements 294, 298. Dielectric material 176 is included with the side views representing first and third magnetoresistive sense elements 292, 296, as well as second and fourth magnetoresistive sense elements 294, 298 to illustrate an out-of-plane location of segments 348, 350 of permanent magnet layer 160 and segments 349, 351 of permanent magnet layer 161 relative to magnetoresistive sense elements 292, 294, 296, 298.

Each of first, second, third, and fourth pinned layers 318, 324, 330, 336 has a reference magnetization 352 oriented substantially parallel to X-Y plane 81. Furthermore, reference magnetization 352 is oriented in the same direction for each of first, second, third, and fourth pinned layers 318, 324, 330, 336. However, reference magnetization 352 is skewed away from each of X-axis 44 and Y-axis 46 by forty-five degrees. Thus, as shown in FIG. 9 and side view representation 346 of FIG. 10, reference magnetization 352 is directed rightwardly on the page. However, as shown in top view representation 344 of FIG. 10, reference magnetization 352 is skewed away from each of X-axis 44 and Y-axis 46.

Each of sense layers 320, 326, 332, 338 of magnetoresistive sense elements 292, 294, 296, 298 has an initial (i.e., self-biased) magnetic orientation, i.e. first sense magnetization 80 (FIG. 3). In accordance with an embodiment, permanent magnet layers 160, 161 function cooperatively to magnetically bias first and third sense layers 320, 332 to produce a second sense magnetization 354. Likewise, permanent magnet layers 160, 161 function cooperatively to magnetically bias second and fourth sense layers 326, 338 to produce a third sense magnetization 356. As shown in both FIGS. 9 and 10, second sense magnetization 354 and third sense magnetization 356 are represented by dotted arrows. The respective directions of each of first sense magnetization 354 and second sense magnetization 356 are skewed away from X-axis 44, Y-axis 46, and Z-axis 42. Thus, in FIG. 9 and side view representation 346 of FIG. 10, second sense magnetization 354 is represented by a rightwardly and upwardly directed dotted arrow and third sense magnetization 356 is represented by a rightwardly and downwardly directed dotted arrow. Additionally in top view representation 344 of FIG. 10, second sense magnetization 354 is represented by a rightwardly and upwardly directed dotted arrow. Likewise, third sense magnetization 356 is represented by a rightwardly and downwardly directed dotted arrow. In general, second and third sense magnetizations 354, 356 are orientable in response to Z magnetic field 30 in Z sensing direction 278.

In order to achieve the particular orientation of second and third sense magnetizations 354, 356, the direction or orientation of the magnetization of segments 348, 350 of permanent magnet layer 160 and the orientation of the magnetization of segments 349, 351 is again skewed away from both of X-axis 44 and Y-axis 46 within X-Y plane 81 by an equivalent angular magnitude, e.g., forty-five degrees. Magnetization direction 186 of segments 348, 349, 350, 351 of permanent magnet layers 160, 161 is again represented by a dashed line arrow 186 in top view representation 344. Again, the single magnetization direction 186 of permanent magnet layer 160, 161, as well as the location and geometry of the various segments of permanent magnet layers 160, 161 achieves the three-axis sensing capability of magnetic field sensor package 54 (FIG. 2), as will be discussed in connection with FIG. 11.

Again utilizing the Miller index notation system, magnetization direction 186 of segments 348, 350 of permanent magnet layer 160 and magnetization direction 186 of segments 349, 351 of permanent magnet layer 161 may be characterized by Miller indices 188 of $[\bar{1}\bar{1}0]$ denoting that magnetization direction 186 is skewed in a negative direction away from both X- and Y-axes 44, 46 within X-Y plane 81 by the same angular magnitude. The orientation, or direction, of reference magnetization 352 for first, second, third, and fourth pinned layers 318, 324, 330, 336 of magnetoresistive sense elements 292, 294, 296, 298 can be characterized by Miller indices of [110] denoting that reference magnetization 352 is also tilted away from X-axis 44 and Y-axis 46 within X-Y plane 81 by the same angular magnitude.

In the absence of an external magnetic field (e.g., Z magnetic field 30), segments 348 of permanent magnet layer 160 and segments 349 of permanent magnet layer 161 positioned proximate first and third magnetoresistive sense elements 292, 296 magnetically bias second sense magnetization 354 in a direction that is skewed away from each of X-axis 44 and Y-axis 46, and is tilted above X-Y plane 81 by an angular magnitude, e.g., forty five degrees. Thus, second sense magnetization 354 is in a first out-of-plane orientation 353. Segments 350 of permanent magnet layer 160 and segments 351 of permanent magnet layer 161 positioned proximate second and fourth magnetoresistive sense elements 294, 298 magnetically bias third sense magnetization 356 in a direction that is skewed away from each of X-axis 44 and Y-axis 46, but is tilted below X-Y plane 81 by the same angular magnitude as second sense magnetization 354. Thus, third sense magnetization 356 is in a second out-of-plane orientation 355. Utilizing the Miller index notation system, first out-of-plane orientation 353 of second sense magnetization 354 can be characterized by Miller indices of [111] and second out-of-plane orientation 355 of third sense magnetization 356 can be characterized by Miller indices of $[11\bar{1}]$.

Figure 11:
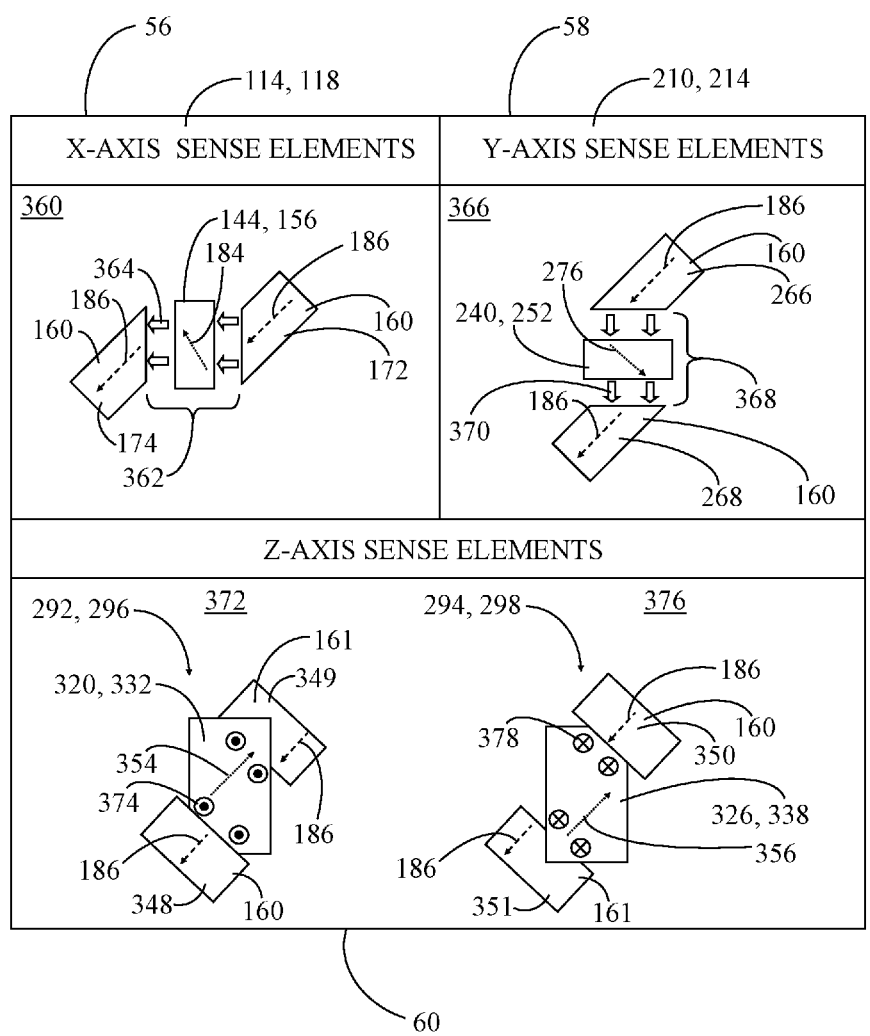
FIG. 11 shows a table of simplified plan views summarizing the function of the segments of the permanent magnet layer for suitably biasing the sense layers of the magnetoresistive sense elements to achieve the three-axis sensing capability of the magnetic field sensor package of FIG. 2.

FIG. 11 shows a table 358 of simplified plan views summarizing the function of the segments of the permanent magnet layer(s) for suitably biasing the sense layers of the magnetoresistive sense elements to achieve the three-axis sensing capability of the magnetic field sensor package 54 (FIG. 2). In a multiple axis magnetic field sensor that includes, for example, X-axis magnetic field sensor 56, Y-axis magnetic field sensor 58, and Z-axis magnetic field sensor 60 the various magnetoresistive sense elements may be manufactured within the same buildup layers. It should be recalled from the discussion associated with FIG. 4 that if a linear gap is patterned or formed through a layer of permanent magnet material that is magnetized in a specific direction, the magnetic field within the gap will be normal to the direction of the gap. By orienting magnetization direction 186 of permanent magnet layer 160 within X-Y plane 81 (and optionally permanent magnet layer 161 within X-Y plane 81) but skewed away from each of X-axis 44 and Y-axis 46 by, for example, forty-five degrees, and by suitably forming the various segments of permanent magnet layers 160, 161, a desired direction of the sense magnetization of the various sense layers for the magnetoresistive sense elements may be achieved.

Thus, as shown in table 358, a first plan view 360 demonstrates a linear gap 362 that is formed between segments 172, 174 of permanent magnet layer 160 associated with second and fourth magnetoresistive sense elements 114, 118. A magnetic field 364 (denoted by block arrows) within linear gap 362 is normal to the direction of linear gap 362. Magnetic field 364 within gap 362 thus magnetically biases the initial sense magnetization, i.e., first sense magnetization 80 (FIG. 3) of second and fourth sense layers 144, 156 of respective second and fourth magnetoresistive sense elements 114, 118 to produce second sense magnetization 184.

As further shown in table 358, a second plan view 366 demonstrates a linear gap 368 that is formed between segments 266, 268 of permanent magnet layer 160 associated second and fourth magnetoresistive sense elements 210, 214. A magnetic field 370 (denoted by block arrows) within linear gap 368 is normal to the direction of linear gap 368. Magnetic field 370 thus magnetically biases the initial sense magnetization, i.e., first sense magnetization 80 (FIG. 3) of second and fourth sense layers 240, 252 of second and fourth magnetoresistive sense elements 210, 214 to produce second sense magnetization 276.

Table 358 additionally includes a third plan view 372 demonstrating a magnetic field 374 (denoted by circles inscribed by a dot to represent magnetic field 374 directed outwardly from the page) produced by segments 348 of permanent magnet layer 160 overlying (in this example illustration) first and third magnetoresistive sense elements 292, 296 and segments 349 of permanent magnet layer 161 underlying (in this example illustration) first and third magnetoresistive sense elements 292, 296 that function cooperatively to magnetically bias first sense magnetization 80 (FIG. 3) of first and third sense layers 320, 332 of first and third magnetoresistive sense elements 292, 296 to produce second sense magnetization 354.

Similarly, table 358 includes a fourth plan view 376 demonstrating a magnetic field 378 (denoted by circles inscribed by an X to represent magnetic field 378 directed inwardly into the page) produced by segments 350 of permanent magnet layer 160 overlying (in this example illustration) second and fourth magnetoresistive sense elements 294, 298 and segments 351 of permanent magnet layer 161 underlying (in this example illustration) second and fourth magnetoresistive sense elements 294, 298 that function cooperatively to magnetically bias second and fourth sense layers 326, 338 of second and fourth magnetoresistive sense elements 294, 298 to produce third sense magnetization 356.

Accordingly, one or more permanent magnet layers, e.g., permanent magnet layers 160, 161, having single magnetization direction 186 that is within X-Y plane 81 but is skewed away from each of X-axis 44 and Y-axis 46 by the same angular magnitude, e.g., forty-five degrees, is useful in achieving the three-axis sensing capability of magnetic field sensor package 54 (FIG. 2) while reducing manufacturing complexity and cost. Furthermore, Z-axis sensing can be achieved without the use of flux guides.

Figure 12:
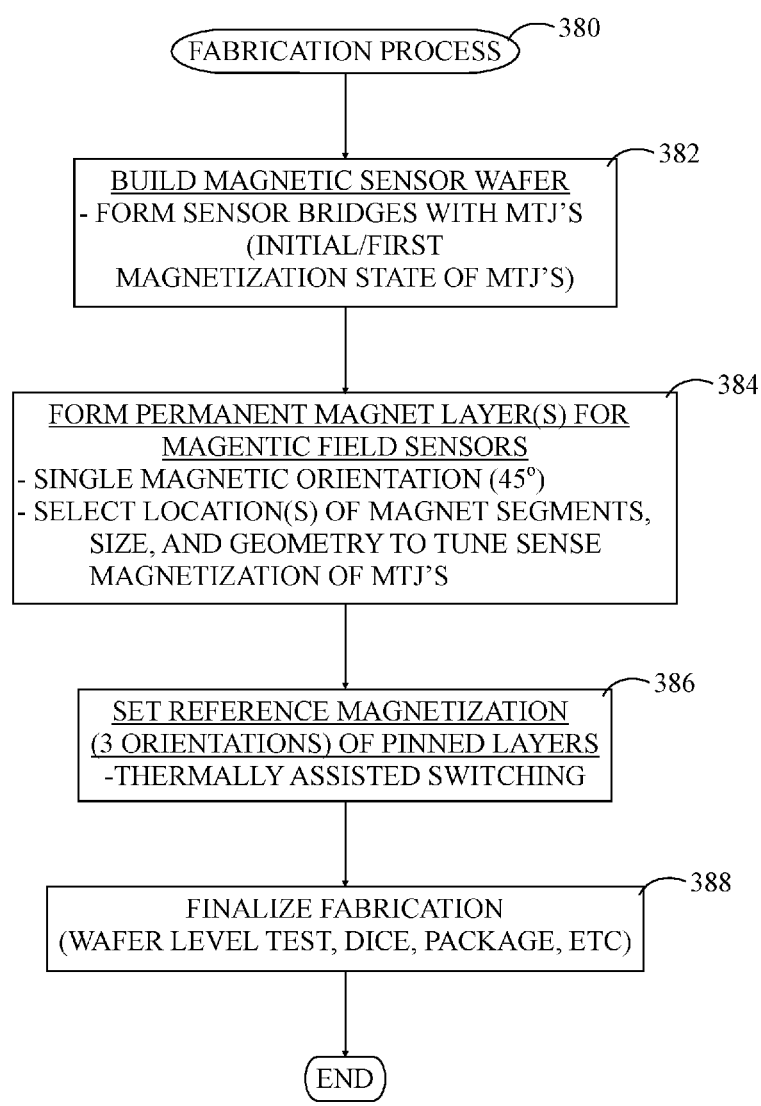
FIG. 12 shows a flowchart of a fabrication process for manufacturing the magnetic field sensor package of FIG. 2.

FIG. 12 shows a flowchart of a fabrication process 380 for manufacturing the magnetic field sensor of FIG. 2. Fabrication process 380 is described in connection with the fabrication of magnetic field sensor package 54 (FIG. 2) having three sense axes (e.g., X-axis, Y-axis, Z-axis magnetic field sensors 56, 58, 60). However, fabrication process 380 may be readily adapted to produce a single or dual sense axis magnetic field sensor.

Those skilled in the art will recognize that fabrication process 380 is exemplary in nature. Thus, only the primary operations of fabrication process 380 are discussed herein for simplicity. Furthermore, the process blocks depicted in FIG. 12 may be performed in parallel with each other or with performing other processes, and each process block will include many separate process steps. In addition, it is to be understood that the particular ordering of the process blocks depicted in FIG. 12 may be modified while achieving substantially the same result. Accordingly, such modifications are intended to be included within the scope of the inventive subject matter.

At a process block 382, a magnetic sensor wafer is built, i.e., fabricated, to produce a plurality of sensor bridges (e.g., X-axis Wheatstone bridge 102 of FIG. 5, Y-axis Wheatstone bridge 198 of FIG. 7, and Z-axis Wheatstone bridge 282 of FIG. 9). Each of the sensors bridges are thus fabricated to include four sensor legs, with each sensor leg having one or more magnetoresistive sense elements, e.g., MTJ's. Furthermore, the magnetoresistive sense elements can be fabricated so that the magnetoresistive sense elements are formed in a common plane (i.e., they are arranged in-plane) relative to one another within a dielectric material with suitable electrically conductive interconnections.

As mentioned previously, the initial orientation of sense magnetization, i.e., first sense magnetization 80, of the sense layers for each of the magnetoresistive sense elements (in the absence of an external magnetic field) is in a single in-plane direction that is skewed away from each of X-axis and Y-axis 46. In some embodiments, the sense layer of each magnetoresistive sense element may be fabricated to include a sense ferromagnetic layer and a non-magnetic layer. The specific structure of the sense layer is not illustrated herein for simplicity. The sense ferromagnetic layer of the sense layer may include any one of Co, Fe, Ni, or an alloy comprising any one or a combination of these elements. The non-magnetic layer may include any one of Pt, Pd, Ta, Hf, Nb, Cr, V, Cu, Au, Ti, Ag, Ru, W, or an alloy comprising any one or a combination of these elements. Through the material properties of the sense ferromagnetic layer and non-magnetic layer of each sense layer, the sense magnetization of the sense layer of each of the magnetoresistive sense elements may be suitably self-biased in the single in-plane direction to produce first sense magnetization 80 (FIG. 3). Other embodiments may employ shape anisotropy, or other existing and upcoming techniques for initially orienting (i.e., self-biasing) the sense magnetization (in the absence of an external magnetic field) parallel to X-Y plane 81.

At a process block 384, one or more permanent magnet layers (e.g., permanent magnet layer 160 of FIGS. 5, 7, and 9 and permanent magnet layer 161 of FIG. 9) is suitably formed in order to magnetically bias the sense magnetization of the magnetoresistive sense elements of each of the Wheatstone bridges, in the absence of an external magnetic field. Considerations for biasing the sense magnetization include selecting locations at which segments of the permanent magnet layer(s) will be positioned, a single out-of-plane spacing of the magnet segments from the magnetoresistive elements, a single thickness of the permanent magnet layer(s), and a single magnetic orientation. Formation of the permanent magnet layer(s) may entail deposition, patterning, and etching of a suitable material to form the magnet segments. Such material may include iron, nickel, cobalt, some alloys of rare earth materials or an alloy comprising any one or a combination of these elements that is magnetized and creates its own persistent magnetic field. Alternatively, the permanent magnet layer could be made directly from the material used for the pinned layer. Preferably, the permanent magnet layer(s) is formed from a magnetically "hard" material that is subjected to processing in a powerful magnetic field during manufacture to align its internal microcrystalline structure, so as to make it very difficult to demagnetize.

At a process block 386, the reference magnetization of the pinned layers of each of the magnetoresistive sense elements is set. In some embodiments, each magnetic field sensor may be programmed by setting the reference magnetization of the magnetoresistive sense elements in the predetermined direction in the X-Y plane of pinned layer. A programming operation may be thermally assisted (e.g., a thermally assisted switching process) wherein the programming operation includes heating selected ones of the MTJ magnetoresistive sense elements to a high temperature threshold. In such a situation, the magnetoresistive sense elements may include an antiferromagnetic layer (not shown) that pins the reference magnetization of the pinned layers at a low temperature threshold and frees the reference magnetization of the pinned layers at the high temperature threshold. Heating the selected magnetoresistive sense elements at the high temperature threshold may be performed by passing a heating current in the selected magnetoresistive sense elements via a current line (not shown). Other techniques may be implemented to provide localized heating, such as from a separate adjacent current line, by using a laser or other radiative source, and so forth. After switching the reference magnetization to the desired fixed magnetization orientation, the selected magnetoresistive sense elements can be cooled to the low temperature threshold to pin, or fix, the reference magnetization in the switched state. Other embodiments may employ existing or upcoming techniques for pinning the reference magnetization to a desired magnetization orientation so as to achieve the multiple fixed orientations of the reference magnetization of the pinned layer of magnetoresistive sense elements. At a process block 388, fabrication of the magnetic sensor wafer continues with fabrication finalization processes such was wafer level testing, dicing, packaging, and the like. Thereafter, fabrication process 380 ends.

In accordance with an embodiment of magnetic field sensor package 54 (FIG. 2) and the execution of fabrication process 380, three different in-plane orientations of the reference magnetization may be set. For example, the single orientation of reference magnetizations 178, 180 (FIG. 5) for X-axis magnetic field sensor 56, the single orientation of reference magnetizations 270, 272 (FIG. 7) for Y-axis magnetic field sensor 58, and the single orientation of reference magnetization 352 for Z-axis magnetic field sensor 60 may be set. Additionally, five different orientations of the sense magnetization may be set. For example, the sense layers of all of the magnetoresistive sense elements are initially self-biased to have first sense magnetization 80. Thereafter, sense layers 144, 156 of second and fourth magnetoresistive sense elements 114, 118 for X-axis magnetic field sensor 56 are magnetically biased by permanent magnet layer 160 to produce second sense magnetization 184 (FIGS. 5-6) while first and third magnetoresistive sense elements 112, 116 retain first sense magnetization 80. Similarly, sense layers 240, 252 of second and fourth magnetoresistive sense elements 210, 214 for Y-axis magnetic field sensor 58 are magnetically biased by permanent magnet layer 160 to produce second sense magnetization 276 (FIGS. 7-8) while first and third magnetoresistive sense elements 208, 212 retain first sense magnetization 80. For Z-axis magnetic field sensor 60, sense layers 320, 332 of first and third magnetoresistive sense elements 292, 296 are magnetically biased by permanent magnet layer 160/161 to produce second sense magnetization 354 and sense layers 326, 338 of second and fourth magnetoresistive sense elements 294, 298 are magnetically biased by permanent magnet layer 160/161 to produce third sense magnetization 356.

Thus, embodiments disclosed herein entail a magnetic field sensor capable of sensing magnetic fields along one or more mutually exclusive sense axes, typically referred to as the X-axis, Y-axis, and Z-axis. An embodiment of a magnetic field sensor comprises magnetic field sensor comprises a sensor bridge having a first leg and a second leg for sensing an external magnetic field along a sensing direction. A first magnetoresistive sense element is formed in the first leg and is located in a plane of the magnetic field sensor, the first magnetoresistive sense element including a first pinned layer and a first sense layer. A second magnetoresistive sense element is formed in the second leg and is located in the plane of the magnetic field sensor, the second magnetoresistive sense element including a second pinned layer and a second sense layer. The first and second pinned layers have a reference magnetization, and each of the first and second sense layers are initially characterized by a first sense magnetization, the first sense magnetization being oriented in a first direction. A permanent magnet layer is proximate the second magnetoresistive sense element, wherein in the absence of the external magnetic field, the permanent magnet layer magnetically biases the first sense magnetization of the second sense layer to produce a second sense magnetization of the second sense layer, the second sense magnetization being oriented in a second direction that differs from the first direction of the first sense magnetization, and the first sense layer of the first magnetoresistive sense element retaining the first sense magnetization.

Another embodiment of a magnetic field sensor comprises a first sensor bridge having a first leg and a second leg for sensing an external magnetic field along a first sensing direction. A first magnetoresistive sense element is formed in the first leg and is located in a plane of the magnetic field sensor, the first magnetoresistive sense element including a first pinned layer and a first sense layer. A second magnetoresistive sense element is formed in the second leg and is located in the plane of the magnetic field sensor, the second magnetoresistive sense element including a second pinned layer and a second sense layer, the first and second pinned layers having a first reference magnetization. The magnetic field sensor further comprises a second sensor bridge having a third leg and a fourth leg for sensing an external magnetic field along a second sensing direction. A third magnetoresistive sense element is formed in the third leg and is located in the plane of the magnetic field sensor, the third magnetoresistive sense element including a third pinned layer and a third sense layer. A fourth magnetoresistive sense element is formed in the fourth leg and is located in the plane of the magnetic field sensor, the fourth magnetoresistive sense element including a fourth pinned layer and a fourth sense layer, the third and fourth pinned layers having a second reference magnetization, and each of the first, second, third, and fourth sense layers initially being characterized by a first sense magnetization, the first sense magnetization being oriented in a first direction. A permanent magnet layer is proximate the second and fourth magnetoresistive sense elements, wherein in the absence of the external magnetic field the permanent magnet layer magnetically biases the first sense magnetization of the second sense layer to produce a second sense magnetization of the second sense layer, the second sense magnetization being oriented in a second direction that differs from the first direction, the permanent magnet layer magnetically biases the first sense magnetization of the fourth sense layer to produce a third sense magnetization of the fourth sense layer, the third sense magnetization being oriented in a third direction that differs from the first and second directions, the first sense layer of the first magnetoresistive sense element retains the first sense magnetization, and the third sense layer of the third magnetoresistive sense element retains the first sense magnetization.

Another embodiment of a magnetic field sensor comprises a first sensor bridge having a first leg and a second leg for sensing an external magnetic field along a sensing direction oriented substantially parallel to a plane of the magnetic field sensor. A first magnetoresistive sense element is formed in the first leg and is located in a plane of the magnetic field sensor, the first magnetoresistive sense element including a first pinned layer and a first sense layer. A second magnetoresistive sense element is formed in the second leg and is located in the plane of the magnetic field sensor, the second magnetoresistive sense element including a second pinned layer and a second sense layer, the first and second pinned layers having a first reference magnetization. The magnetic field sensor further comprises a second sensor bridge having a third leg and a fourth leg for sensing the external magnetic field along a second sensing direction oriented substantially perpendicular to the plane. A third magnetoresistive sense element is formed in the third leg and is located in the plane of the magnetic field sensor, the third magnetoresistive sense element including a third pinned layer and a third sense layer. A fourth magnetoresistive sense element is formed in the fourth leg and is located in the plane of the magnetic field sensor, the fourth magnetoresistive sense element including a fourth pinned layer and a fourth sense layer, the third and fourth pinned layers having a second reference magnetization, and each of the first, second, third, and fourth sense layers initially being characterized by a first sense magnetization, the first sense magnetization being oriented in a first direction. A permanent magnet layer is positioned proximate the second, third, and fourth magnetoresistive sense elements, the permanent magnet layer being characterized by a single magnetic orientation, wherein in the absence of the external magnetic field the permanent magnet layer magnetically biases the first sense magnetization of the second sense layer to produce a second sense magnetization of the second sense layer, the second sense magnetization being oriented in a second direction that differs from the first direction of the first sense magnetization, and the first sense layer of the first magnetoresistive sense element retains the first sense magnetization, the permanent magnet layer magnetically biases the first sense magnetization of the third sense layer to produce a third sense magnetization of the third sense layer that is oriented in a third direction that differs from the first direction, and the permanent magnet layer magnetically biases the first sense magnetization of the fourth sense layer to produce a fourth sense magnetization of the fourth sense layer that is oriented in a fourth direction that differs from the first direction.

Accordingly, a unique sensor bridge design of magnetoresistive sense elements is implemented for each sense axis. Each sensor bridge incorporates an in-plane orientation of reference magnetization of the pinned layer. For each sensor bridge, one or more permanent magnet layers are strategically patterned (shape and position) to generate a unique external bias field vector of the sense magnetization of the sense layer to produce a balanced bridge configuration of magnetoresistive sense elements for the sensor bridge. Additionally, one sensor bridge design is utilized for sensing an external magnetic field that is perpendicular to the plane of the magnetic field sensor package without the use of flux concentrators. The strategically patterned permanent magnet layer(s) for this sensor bridge additionally allows it to respond to the out-of-plane external magnetic field without inter-axis coupling of sensor response. The various inventive concepts and principles embodied herein enable an ultra-low power, multiple sense axis magnetic field sensor without detrimental perming effects for improved sensitivity, reliability, and cost savings.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A magnetic field sensor comprising:
    a sensor bridge having a first leg and a second leg for sensing an external magnetic field along a sensing direction;
    a first magnetoresistive sense element formed in said first leg and located in a plane of said magnetic field sensor, said first magnetoresistive sense element including a first pinned layer and a first sense layer;
    a second magnetoresistive sense element formed in said second leg and located in said plane of said magnetic field sensor, said second magnetoresistive sense element including a second pinned layer and a second sense layer, said first and second pinned layers having a reference magnetization, and each of said first and second sense layers initially being characterized by a first sense magnetization, said first sense magnetization being oriented in a first direction; and
    a permanent magnet layer proximate said second magnetoresistive sense element, wherein in the absence of said external magnetic field, said permanent magnet layer magnetically biases said first sense magnetization of said second sense layer to produce a second sense magnetization of said second sense layer, said second sense magnetization being oriented in a second direction that differs from said first direction of said first sense magnetization, and said first sense layer of said first magnetoresistive sense element retaining said first sense magnetization.

2. The magnetic field sensor of claim 1 wherein said reference magnetization of each of said first and second pinned layers is oriented in the same direction substantially parallel to said plane.

3. The magnetic field sensor of claim 1 wherein in the absence of said external magnetic field, said first direction of said first sense magnetization is in a first in-plane orientation relative to said plane, and said second direction of said second sense magnetization is in a second in-plane orientation relative to said plane.

4. The magnetic field sensor of claim 1 wherein:
said first direction of said first sense magnetization is a first <hkl> direction, wherein h, k, and l are Miller indices, in which "h" and "k" are non-zero, "l" is zero, and <hkl> represents a family of directions; and
said second direction of said second sense magnetization is a second <hkl> direction relative to said first <hkl> direction, wherein one of said "h" and "k" of said second <hkl> direction is a negative value of a corresponding one of said "h" and "k" of said first <hkl> direction, and "l" of said second <hkl> direction is zero.

5. The magnetic field sensor of claim 1 wherein said plane of said magnetic field sensor is characterized by a first axis and a second axis that is orthogonal to said first axis, and said sensing direction is parallel to one of said first and second axes.

6. The magnetic field sensor of claim 1 wherein said permanent magnet layer is characterized by a single magnetic orientation.

7. The magnetic field sensor of claim 6 wherein said plane of said magnetic field sensor is defined by a first axis and a second axis that is orthogonal to said first axis, and said single magnetic orientation is substantially parallel to said plane of said magnetic field sensor and is tilted away from each of said first and second axes within said plane by an equivalent angular magnitude.

8. The magnetic field sensor of claim 1 wherein said sensor bridge is a first sensor bridge, said sensing direction is a first sensing direction substantially parallel to said plane of said magnetic field sensor, said reference magnetization is a first reference magnetization, and said magnetic field sensor further comprises:
a second sensor bridge having a third leg and a fourth leg for sensing said external magnetic field along a second sensing direction oriented substantially perpendicular to said plane;
a third magnetoresistive sense element formed in said third leg and located in said plane of said magnetic field sensor, said third magnetoresistive sense element including a third pinned layer and a third sense layer;
a fourth magnetoresistive sense element formed in said fourth leg and located in said plane of said magnetic field sensor, said fourth magnetoresistive sense element including a fourth pinned layer and a fourth sense layer, said third and fourth pinned layers having a second reference magnetization, and each of said third and fourth sense layers initially being characterized by said first sense magnetization oriented in said first direction; and
said permanent magnet layer is positioned proximate said third and fourth magnetoresistive sense elements, wherein in the absence of said external magnetic field, said permanent magnet layer magnetically biases said first sense magnetization of said third sense layer to produce a third sense magnetization of said third sense layer that is oriented in a third direction that differs from said first direction, and said permanent magnet layer magnetically biases said first sense magnetization of said fourth sense layer to produce a fourth sense magnetization of said fourth sense layer that is oriented in a fourth direction that differs from said first direction.

9. The magnetic field sensor of claim 8 wherein in the absence of said external magnetic field, said first direction of said first sense magnetization is in a first in-plane orientation relative to said plane, said second direction of said second sense magnetization is in a second in-plane orientation relative to said plane, said third direction of said third sense magnetization is in a first out-of-plane orientation relative to said plane, and said fourth direction of said fourth sense magnetization is in a second out-of-plane orientation relative to said plane.

10. The magnetic field sensor of claim 8 wherein:
said third direction of said third sense magnetization is tilted above said plane of said magnetic field sensor by a first angular magnitude; and
said fourth direction of said fourth sense magnetization is tilted below said plane of said magnetic field sensor by a second angular magnitude that is equivalent to said first angular magnitude.

11. The magnetic field sensor of claim 8 wherein each of said third and fourth directions of said third and fourth sense magnetizations is non-perpendicular to said plane of said magnetic field sensor.

12. The magnetic field sensor of claim 8 wherein:
said third direction of said third sense magnetization is a first <hkl> direction, wherein h, k, and l are Miller indices, in which "h" and "k" and "l" are non-zero, and <hkl> represents a family of directions; and
said fourth direction of said fourth sense magnetization is a second <hkl> direction relative to said first <hkl> direction, wherein "h" and "k" of said second <hkl> direction is the same as "h" and "k" of first <hkl> direction, and "l" of said second <hkl> direction is a negative value of "l" of said first <hkl> direction.

13. A magnetic field sensor comprising:
a first sensor bridge having a first leg and a second leg for sensing an external magnetic field along a first sensing direction;
a first magnetoresistive sense element formed in said first leg and located in a plane of said magnetic field sensor, said first magnetoresistive sense element including a first pinned layer and a first sense layer;
a second magnetoresistive sense element formed in said second leg and located in said plane of said magnetic field sensor, said second magnetoresistive sense element including a second pinned layer and a second sense layer, said first and second pinned layers having a first reference magnetization;
a second sensor bridge having a third leg and a fourth leg for sensing an external magnetic field along a second sensing direction;
a third magnetoresistive sense element formed in said third leg and located in said plane of said magnetic field sensor, said third magnetoresistive sense element including a third pinned layer and a third sense layer;
a fourth magnetoresistive sense element formed in said fourth leg and located in said plane of said magnetic field sensor, said fourth magnetoresistive sense element including a fourth pinned layer and a fourth sense layer, said third and fourth pinned layers having a second reference magnetization, and each of said first, second, third, and fourth sense layers initially being characterized by a first sense magnetization, said first sense magnetization being oriented in a first direction; and a permanent magnet layer proximate said second and fourth magnetoresistive sense elements, wherein in the absence of said external magnetic field:

said permanent magnet layer magnetically biases said first sense magnetization of said second sense layer to produce a second sense magnetization of said second sense layer, said second sense magnetization being oriented in a second direction that differs from said first direction;

said permanent magnet layer magnetically biases said first sense magnetization of said fourth sense layer to produce a third sense magnetization of said fourth sense layer, said third sense magnetization being oriented in a third direction that differs from said first and second directions;

said first sense layer of said first magnetoresistive sense element retains said first sense magnetization; and said third sense layer of said third magnetoresistive sense element retains said first sense magnetization.

14. The magnetic field sensor of claim 13 wherein said plane of said magnetic field sensor is defined by a first axis and a second axis that is orthogonal to said first axis, said permanent magnet layer is characterized by a single magnetic orientation that is oriented substantially parallel to said plane of said magnetic field sensor and is tilted away from each of said first and second axes within said plane by an equivalent angular magnitude.

15. The magnetic field sensor of claim 13 wherein in the absence of said external magnetic field, said first direction of said first sense magnetization is in a first in-plane orientation relative to said plane, said second direction of said second sense magnetization is in a second in-plane orientation relative to said plane, and said third direction of said third sense magnetization is in a third in-plane orientation relative to said plane.

16. The magnetic field sensor of claim 13 wherein:

said first direction of said first sense magnetization is a first <hkl> direction, wherein h, k, and l are Miller indices, <hkl> represents a family of directions, said first <hkl> direction of said first and third sense magnetizations of said first and third magnetoresistive sense elements being characterized by said Miller indices of [110];

said second direction of said second sense magnetization is a second <hkl> direction, said second <hkl> direction of said second sense magnetization of said second magnetoresistive sense element being characterized by said Miller indices of [$\bar{1}$10]; and said third direction of said third sense magnetization is a third <hkl> direction, said third <hkl> direction of said fourth sense magnetization of said fourth magnetoresistive sense element being characterized by said Miller indices of [1$\bar{1}$0].

17. A magnetic field sensor comprising:

a first sensor bridge having a first leg and a second leg for sensing an external magnetic field along a sensing direction oriented substantially parallel to a plane of said magnetic field sensor;

a first magnetoresistive sense element formed in said first leg and located in a plane of said magnetic field sensor, said first magnetoresistive sense element including a first pinned layer and a first sense layer;

a second magnetoresistive sense element formed in said second leg and located in said plane of said magnetic field sensor, said second magnetoresistive sense element including a second pinned layer and a second sense layer, said first and second pinned layers having a first reference magnetization;

a second sensor bridge having a third leg and a fourth leg for sensing said external magnetic field along a second sensing direction oriented substantially perpendicular to said plane;

a third magnetoresistive sense element formed in said third leg and located in said plane of said magnetic field sensor, said third magnetoresistive sense element including a third pinned layer and a third sense layer;

a fourth magnetoresistive sense element formed in said fourth leg and located in said plane of said magnetic field sensor, said fourth magnetoresistive sense element including a fourth pinned layer and a fourth sense layer, said third and fourth pinned layers having a second reference magnetization, and each of said first, second, third, and fourth sense layers initially being characterized by a first sense magnetization, said first sense magnetization being oriented in a first direction; and a permanent magnet layer positioned proximate said second, third, and fourth magnetoresistive sense elements, said permanent magnet layer being characterized by a single magnetic orientation, wherein in the absence of said external magnetic field:

said permanent magnet layer magnetically biases said first sense magnetization of said second sense layer to produce a second sense magnetization of said second sense layer, said second sense magnetization being oriented in a second direction that differs from said first direction of said first sense magnetization, and said first sense layer of said first magnetoresistive sense element retaining said first sense magnetization;

said permanent magnet layer magnetically biases said first sense magnetization of said third sense layer to produce a third sense magnetization of said third sense layer that is oriented in a third direction that differs from said first direction; and said permanent magnet layer magnetically biases said first sense magnetization of said fourth sense layer to produce a fourth sense magnetization of said fourth sense layer that is oriented in a fourth direction that differs from said first direction.

18. The magnetic field sensor of claim 17 wherein in the absence of said external magnetic field, said first direction of said first sense magnetization is in a first in-plane orientation relative to said plane, said second direction of said second sense magnetization is in a second in-plane orientation relative to said plane, said third direction of said third sense magnetization is in a first out-of-plane orientation relative to said plane, and said fourth direction of said fourth sense magnetization is in a second out-of-plane orientation relative to said plane.

19. The magnetic field sensor of claim 17 wherein:

said third direction of said third sense magnetization is tilted above said plane of said magnetic field sensor by a first angular magnitude; and said fourth direction of said fourth sense magnetization is tilted below said plane of said magnetic field sensor by a second angular magnitude that is equivalent to said first angular magnitude; and each of said third and fourth directions of said third and fourth sense magnetizations is non-perpendicular to said plane of said magnetic field sensor.

20. The magnetic field sensor of claim 17 wherein:

said first direction of said first sense magnetization is a first <hkl> direction, wherein h, k, and l are Miller indices, <hkl> represents a family of directions, said first <hkl> direction being characterized by said Miller indices of [110];

said second direction of said second sense magnetization is a second <hkl> direction relative to said first <hkl> direction, wherein one of said "h" and "k" of said second <hkl> direction is a negative value of a corresponding one of said "h" and "k" of said first <hkl> direction, and "l" of said second <hkl> direction is zero, said second sense magnetization of said second magnetoresistive sense element being characterized by said Miller indices of [$\bar{1}$10] or [1$\bar{1}$0];

said third direction of said third sense magnetization is a third <hkl> direction, said third sense magnetization of said third magnetoresistive sense element being characterized by said Miller indices of [111]; and said fourth direction of said fourth sense magnetization is a fourth <hkl> direction, said fourth sense magnetization of said fourth magnetoresistive sense element being characterized by said Miller indices of [11$\bar{1}$].

* * * * *